(12) United States Patent
Tamari et al.

(10) Patent No.: US 11,566,339 B2
(45) Date of Patent: Jan. 31, 2023

(54) PLATING METHOD AND PLATING APPARATUS

(71) Applicant: EBARA CORPORATION, Tokyo (JP)

(72) Inventors: Yusuke Tamari, Sacramento, CA (US); Akira Owatari, Sacramento, CA (US); Mizuki Nagai, Tokyo (JP); Shingo Yasuda, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 84 days.

(21) Appl. No.: 17/167,829

(22) Filed: Feb. 4, 2021

(65) Prior Publication Data

US 2021/0164125 A1 Jun. 3, 2021

Related U.S. Application Data

(60) Continuation of application No. 16/379,416, filed on Apr. 9, 2019, now Pat. No. 10,941,504, which is a division of application No. 14/597,216, filed on Jan. 14, 2015, now Pat. No. 10,294,580.

(60) Provisional application No. 61/928,673, filed on Jan. 17, 2014.

(51) Int. Cl.
| | |
|---|---|
| *C25D 21/14* | (2006.01) |
| *C25D 21/12* | (2006.01) |
| *C25D 7/12* | (2006.01) |
| *C25D 5/02* | (2006.01) |
| *C25D 17/00* | (2006.01) |
| *C25D 21/10* | (2006.01) |

(52) U.S. Cl.
CPC ............. *C25D 21/14* (2013.01); *C25D 7/123* (2013.01); *C25D 21/12* (2013.01); *C25D 5/02* (2013.01); *C25D 17/001* (2013.01); *C25D 21/10* (2013.01)

(58) Field of Classification Search
CPC ............ C25D 7/12–123; C25D 17/001; H01L 21/2885; H01L 21/76873
See application file for complete search history.

(56) References Cited

U.S. PATENT DOCUMENTS

| | | | |
|---|---|---|---|
| 4,812,210 A | 3/1989 | Bonivert et al. | |
| 4,834,842 A | 5/1989 | Langner et al. | |
| 6,511,588 B1 | 1/2003 | Kobayashi et al. | |
| 2001/0042694 A1 | 11/2001 | Robertson | |
| 2002/0053516 A1 | 5/2002 | Basol et al. | |

(Continued)

FOREIGN PATENT DOCUMENTS

| | | |
|---|---|---|
| CN | 1433487 A | 7/2003 |
| CN | 1551295 A | 12/2004 |

(Continued)

*Primary Examiner* — Ho-Sung Chung
(74) *Attorney, Agent, or Firm* — BakerHostetler

(57) ABSTRACT

A plating method capable of controlling a concentration of an additive within a proper range during plating of a substrate is disclosed. The plating method includes: disposing an anode and a substrate, having a via-hole formed in a surface thereof, so as to face each other in a plating solution containing an additive; applying a voltage between the anode and the substrate for filling the via-hole with metal; measuring the voltage applied to the substrate; calculating an amount of change in the voltage per predetermined time; and adjusting a concentration of the additive in the plating solution to keep the amount of change in the voltage within a predetermined control range.

3 Claims, 18 Drawing Sheets

(56) References Cited

U.S. PATENT DOCUMENTS

| | | | |
|---|---|---|---|
| 2003/0000840 A1* | 1/2003 | Kimura | H01L 21/2885 205/81 |
| 2004/0037682 A1 | 2/2004 | Yoshioka et al. | |
| 2004/0069648 A1 | 4/2004 | Andricacos et al. | |
| 2004/0226827 A1 | 11/2004 | Matsuda et al. | |
| 2005/0051433 A1 | 3/2005 | Zdunek et al. | |
| 2005/0109624 A1 | 5/2005 | King et al. | |
| 2005/0274604 A1 | 12/2005 | Saito et al. | |
| 2006/0266653 A1 | 11/2006 | Birang et al. | |
| 2007/0056856 A1 | 3/2007 | Hong | |
| 2007/0261963 A1 | 11/2007 | Han et al. | |
| 2009/0020434 A1 | 1/2009 | Susaki et al. | |
| 2012/0064462 A1 | 3/2012 | Willey et al. | |
| 2013/0023166 A1 | 1/2013 | Liu et al. | |
| 2014/0299476 A1 | 10/2014 | Yasuda et al. | |
| 2015/0203983 A1* | 7/2015 | Tamari | C25D 21/14 205/83 |

FOREIGN PATENT DOCUMENTS

| | | |
|---|---|---|
| CN | 102392278 A | 3/2012 |
| CN | 102471919 A | 5/2012 |
| JP | S62-124300 A | 6/1987 |
| JP | H08-178893 A | 7/1996 |
| JP | H08-178894 A | 7/1996 |
| JP | 2002-368384 A | 12/2002 |
| JP | 2003-268590 A | 9/2003 |
| JP | 2006-317197 A | 11/2006 |
| JP | 2009-091601 A | 4/2009 |

\* cited by examiner

PLATING METHOD AND PLATING APPARATUS

CROSS REFERENCE TO RELATED APPLICATION

This application is a Divisional of U.S. application Ser. No. 16/379,416 filed Apr. 9, 2019, which is a Divisional of U.S. application Ser. No. 14/597,216 filed Jan. 14, 2015, patented as U.S. Pat. No. 10,294,580, May 21, 2019, which claims priority to U.S. Provisional Application No. 61/928,673 filed Jan. 17, 2014, the entire contents of which are hereby incorporated by reference.

BACKGROUND

A copper plating process is widely used in a technique of manufacturing interconnects of semiconductor devices. With the progress toward high integration of semiconductor devices, circuit interconnects become finer and as a result microfabrication in two-dimensional direction is approaching a limit. Thus, a TSV (through-silicon via) technique is expected to be a technique that can further improve a device performance. This TSV technique is a three-dimensional layering technique for fabricating a through-electrode by filling a via-hole with a conductive material, such as copper, to establish an electrical connection between semiconductor chips through the through-electrode.

An important point for filling the metal into the via-hole with no void is to accelerate metal deposition on a bottom of the via-hole while suppressing metal deposition on a field surface of the substrate. Therefore, an accelerator for accelerating the metal deposition and a suppressive-component containing agent (e.g., a suppressor (for example, PEG or polyethylene glycol) and a leveler) for suppressing the metal deposition are typically added to a plating solution. Specifically, in order to fill the via-hole, having a depth of 50 μm to 200 μm, with copper, the suppressive-component containing agent having a very strong suppressive effect must be used. The accelerator and the suppressive-component containing agent may be collectively referred to as additive.

In order to fill the via-hole with metal with no void therein, it is important to control a concentration of an additive during plating. A CVS (Cyclic Voltammetric Stripping) technique is conventionally used for concentration analysis of the additive. However, the additive in the plating solution may produce by-products with the progress of plating, and the by-products may have an adverse influence on the concentration analysis results. As a consequence, the concentration of the additive may not be controlled correctly, and a void may be formed in the metal. Further, characteristics of a plated film, such as a crystal grain size and an orientation of a plated copper, may change due to action of the additive. Therefore, if the concentration of the additive is not controlled properly, the characteristics of the plated film may be varied from substrate to substrate. In particular, in the case of using the suppressive-component containing agent having a very strong suppressive effect, it is difficult to correctly measure the concentration of the suppressive-component containing agent with use of the CVS technique because the by-products affect the analysis.

In order to rapidly fill the via-hole with metal, it has been a conventional practice to increase a current density on a substrate during plating of the substrate. In order to fill the via-hole with metal rapidly while preventing formation of void, it is necessary to increase the current density when the majority of the via-hole is filled with the metal. However, it is difficult to accurately determine a filling percentage of the metal in the via-hole because the progress of plating is judged based on a plating time. As a result, the current density may not be increased at a proper timing. If a timing of increasing the current density is too early, a void is formed in the via-hole. On the other hand, if the timing of increasing the current density is too late, a time required for the plating cannot be shortened.

Typically, a plating end point is controlled based only on the plating time. However, since a manner of the progress of plating is varied depending on a plating process, controlling the plating end point based only on the plating time may result in insufficient plating or excessive plating.

SUMMARY OF THE INVENTION

According to an embodiment, there is provided a plating method and a plating apparatus capable of controlling a concentration of an additive within an appropriate range during plating of a substrate.

According to an embodiment, there is provided a plating method and a plating apparatus capable of accurately determining a progress of substrate plating and capable of reducing a plating time.

According to an embodiment, there is provided a plating method and a plating apparatus capable of accurately determining a plating end point.

Embodiments, which will be described below, relate to an interconnect-forming technique for semiconductor devices, and more particularly to a plating method and a plating apparatus for filling metal, such as copper, into a via-hole formed in a surface of a substrate, such as wafer.

In an embodiment, there is provided a plating method comprising: disposing an anode and a substrate, having a via-hole formed in a surface thereof, so as to face each other in a plating solution containing an additive; applying a voltage between the anode and the substrate for filling the via-hole with metal; measuring the voltage applied to the substrate; calculating an amount of change in the voltage per predetermined time; and adjusting a concentration of the additive in the plating solution to keep the amount of change in the voltage within a predetermined control range.

Measuring of the voltage is not limited to measuring of the voltage between the substrate and the anode, and other measuring method that can detect a change in an electric potential on the substrate may be used. For example, a voltage between a reference electrode immersed in the plating solution and the substrate may be measured.

In an embodiment, there is provided a plating method comprising: extracting a plating solution containing an additive from a plating bath for plating a substrate; immersing a first electrode and a second electrode in the extracted plating solution; applying a voltage between the first electrode and the second electrode; measuring the voltage applied to the second electrode on which metal is deposited; calculating an amount of change in the voltage per predetermined time; and adjusting a concentration of the additive in the plating solution to keep the amount of change in the voltage within a predetermined control range.

In an embodiment, there is provided a plating method comprising: disposing an anode and a substrate, having a via-hole formed in a surface thereof, so as to face each other in a plating solution containing an additive; applying a voltage between the anode and the substrate for filling the via-hole with metal; measuring the voltage applied to the substrate; calculating an amount of change in the voltage per predetermined time; and increasing a current density on the substrate when the amount of change in the voltage increases in excess of a predetermined variation range.

In an embodiment, there is provided a plating method comprising: disposing an anode and a substrate, having a via-hole formed in a surface thereof, so as to face each other in a plating solution containing an additive; applying a voltage between the anode and the substrate for filling the via-hole with metal; measuring the voltage applied to the substrate; calculating an amount of change in the voltage per predetermined time; and stopping application of the voltage when the amount of change in the voltage decreases in excess of a predetermined variation range.

In an embodiment, there is provided a plating method comprising: disposing an anode and a substrate, having a via-hole formed in a surface thereof, so as to face each other in a plating solution containing an additive; applying a voltage between the anode and the substrate for filling the via-hole with metal; measuring the voltage applied to the substrate; calculating an amount of change in the voltage per predetermined time; and determining a point of time at which the amount of change in the voltage exceeds a predetermined first threshold value; and then stopping application of the voltage when a preset time has elapsed from a point of time at which the amount of change in the voltage decreases below a predetermined second threshold value.

In an embodiment, there is provided a plating method comprising: disposing an anode and a substrate, having a via-hole formed in a surface thereof, so as to face each other in a plating solution containing an additive; performing a first plating process of applying a voltage between the anode and the substrate to deposit metal upwardly from a bottom of the via-hole at a first current density; measuring the voltage applied to the substrate; calculating an amount of change in the voltage per predetermined time; and performing a second plating process of increasing the voltage applied between the anode and the substrate when the amount of change in the voltage increases in excess of a predetermined variation range to fill the via-hole with the metal at a second current density that is higher than the first current density.

In an embodiment, there is provided a plating apparatus comprising: a plating bath configured to hold a plating solution containing an additive; a substrate holder configured to hold a substrate having a via-hole formed in a surface of the substrate; an anode facing the substrate when held by the substrate holder; a power source configured to apply a voltage between the substrate and the anode; a voltage measuring device configured to measure the voltage applied to the substrate; a plating controller configured to control a concentration of the additive in the plating solution based on a measured value of the voltage; and a concentration adjuster configured to adjust the concentration of the additive in the plating solution according to a command from the plating controller; the plating controller is configured to calculate an amount of change in the voltage per predetermined time, and emit a command to the concentration adjuster to permit the concentration adjuster to adjust the concentration of the additive in the plating solution to keep the amount of change in the voltage within a predetermined control range.

In an embodiment, there is provided a plating apparatus comprising: a plating bath configured to hold a plating solution containing an additive; a substrate holder configured to hold a substrate having a via-hole formed in a surface of the substrate; an anode facing the substrate when held by the substrate holder; a first power source configured to apply a voltage between the substrate and the anode; a plating solution analyzer configured to analyze the plating solution; and a concentration adjuster configured to adjust a concentration of the additive in the plating solution; the plating solution analyzer includes an analyzing bath configured to store the plating solution extracted from the plating bath, a first electrode and a second electrode immersed in the plating solution in the analyzing bath, a second power source configured to apply a voltage between the first electrode and the second electrode, a voltage measuring device configured to measure the voltage applied to the second electrode on which metal is deposited, and a plating controller configured to control the concentration of the additive in the plating solution held in the plating bath based on a measured value of the voltage; and the plating controller is configured to calculate an amount of change in the voltage per predetermined time, and emit a command to the concentration adjuster to permit the concentration adjuster to adjust the concentration of the additive in the plating solution to keep the amount of change in the voltage within a predetermined control range.

In an embodiment, there is provided a plating apparatus comprising: a plating bath configured to hold a plating solution containing an additive; a substrate holder configured to hold a substrate having a via-hole formed in a surface of the substrate; an anode facing the substrate when held by the substrate holder; a power source configured to apply a voltage between the substrate and the anode; a voltage measuring device configured to measure the voltage applied to the substrate; and a plating controller configured to calculate an amount of change in the voltage per predetermined time and to emit a command to the power source, when the amount of change in the voltage increases in excess of a predetermined variation range, to permit the power source to increase the voltage to thereby increase a current density on the substrate.

In an embodiment, there is provided a plating apparatus comprising: a plating bath configured to hold a plating solution containing an additive; a substrate holder configured to hold a substrate having a via-hole formed in a surface of the substrate; an anode facing the substrate when held by the substrate holder; a power source configured to apply a voltage between the substrate and the anode; a voltage measuring device configured to measure the voltage applied to the substrate; and a plating controller configured to calculate an amount of change in the voltage per predetermined time and to emit a command to the power source, when the amount of change in the voltage decreases in excess of a predetermined variation range, to permit the power source to stop application of the voltage.

In an embodiment, there is provided a plating apparatus comprising: a plating bath configured to hold a plating solution containing an additive; a substrate holder configured to hold a substrate having a via-hole formed in a surface of the substrate; an anode facing the substrate when held by the substrate holder; a power source configured to apply a voltage between the substrate and the anode; a voltage measuring device configured to measure the voltage applied to the substrate; and a plating controller configured to calculate an amount of change in the voltage per predetermined time based on a measured value of the voltage; the plating controller is configured to determine a point of time at which the amount of change in the voltage exceeds a predetermined first threshold value, and then emit a command to the power source, when a preset time has elapsed from a point of time at which the amount of change in the voltage decreases below a predetermined second threshold, to permit the power source to stop application of the voltage.

In an embodiment, there is provided a plating apparatus comprising: a plating bath configured to hold a plating solution containing an additive; a substrate holder configured to hold a substrate having a via-hole formed in a surface of the substrate; an anode facing the substrate when held by the substrate holder; a power source configured to apply a voltage between the substrate and the anode; a voltage measuring device configured to measure the voltage applied to the substrate; and a plating controller configured to calculate an amount of change in the voltage per predetermined time based on a measured value of the voltage; the plating controller is configured to emit a command to the power source to permit the power source to apply the voltage between the substrate and the anode to thereby deposit a metal upwardly from a bottom of the via-hole at a first current density, and emit a command to the power source, when the amount of change in the voltage increases in excess of a predetermined variation range, to permit the power source to increase the voltage applied between the substrate and the anode to thereby fill the via-hole with the metal at a second current density that is higher than the first current density.

The amount of change in the voltage per predetermined time varies depending on the concentration of the additive in the plating solution. Therefore, according to the above-described embodiments, it is possible to control the concentration of the additive within a proper range based on the amount of change in the voltage. As a result, the substrate having a metal film with uniform characteristics can be obtained with no defect, such as void.

An electrical resistance between the substrate and the anode changes according to a growth of the metal film. This is due to a change in thickness of the metal film and a change in a manner of an adherence of the additive to the metal film. Therefore, according to the above-described embodiments, the plating time can be shortened by accurately monitoring the progress of plating based on the change in the voltage and by increasing the current density at a proper timing.

As described above, the electrical resistance between the substrate and the anode changes according to the growth of the metal film. According to the above-described embodiments, a plating end point can be accurately determined based on the change in the voltage.

DESCRIPTION OF EMBODIMENTS

Figure 1:
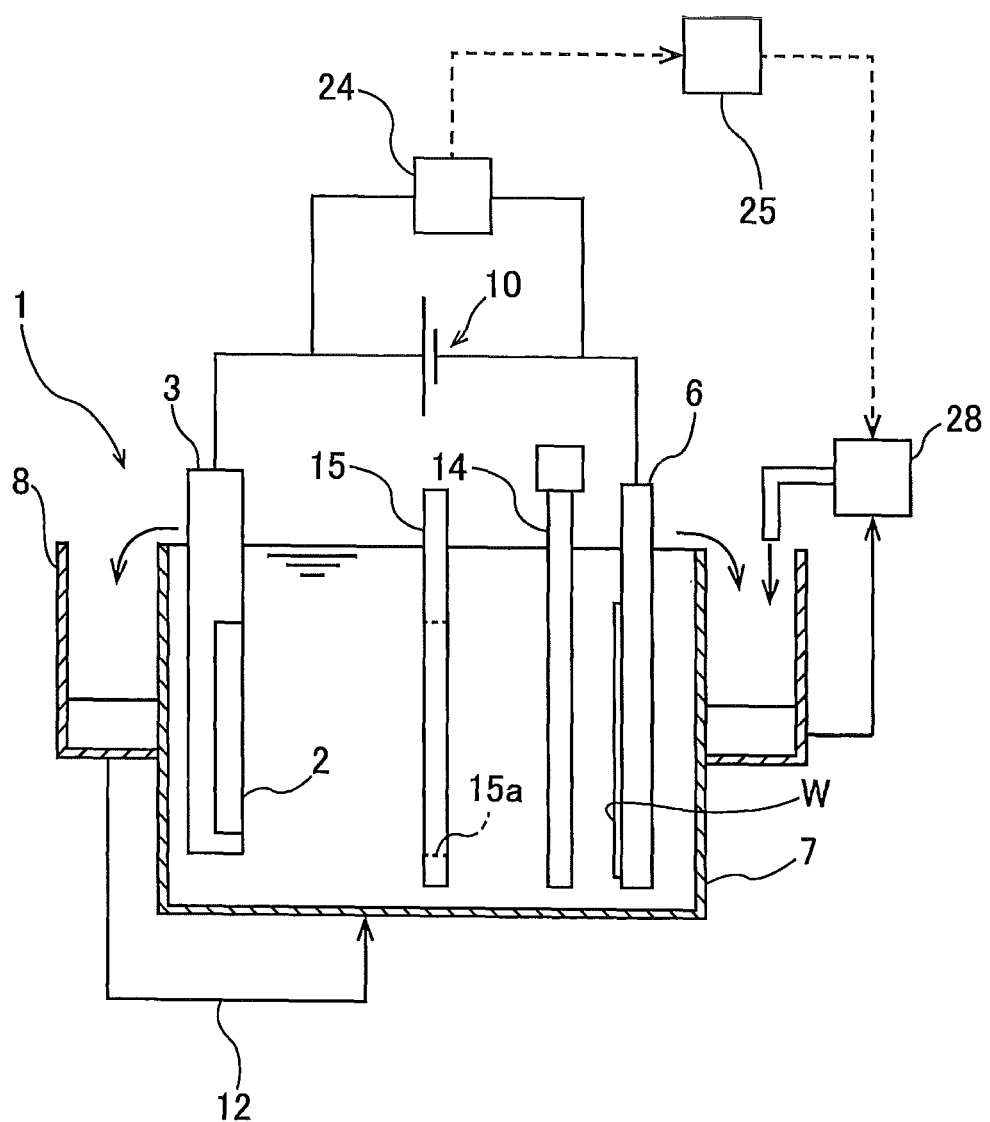
FIG. 1 is a schematic view showing an embodiment of a plating apparatus.
Figure 2:
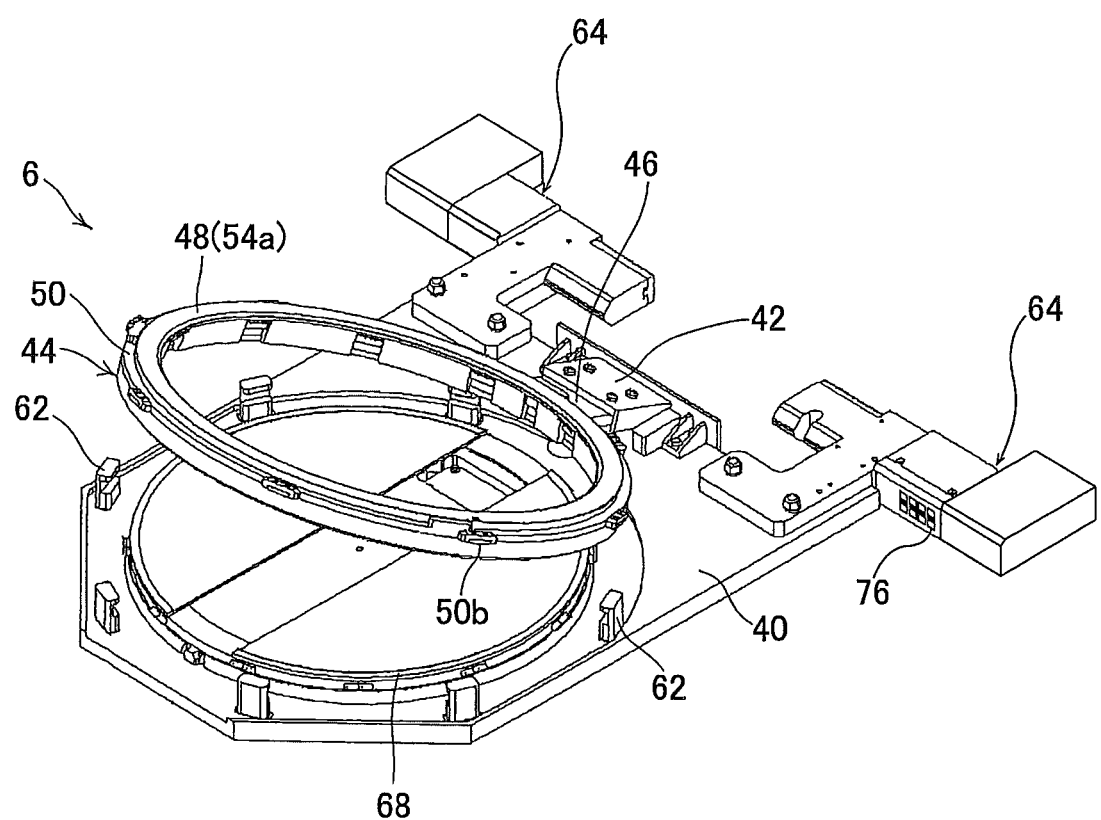
FIG. 2 is a perspective view showing a substrate holder.

Embodiments will be described below with reference to the drawings. In FIGS. 1 through 18, identical or corresponding components will be denoted by identical reference numerals, and repetitive descriptions thereof are omitted. The following embodiments show examples of filling a via-hole, formed in a surface of a substrate, with copper.

FIG. 1 is a schematic view showing an embodiment of a plating apparatus. As shown in FIG. 1, the plating apparatus includes a plating bath 1, which has an inner bath 7 for storing a plating solution therein and an overflow bath 8 adjacent to the inner bath 7. The plating solution overflows an upper edge of the inner bath 7 into the overflow bath 8. One end of a plating-solution circulation line 12 for circulating the plating solution is connected to a bottom of the overflow bath 8, and other end of the plating-solution circulation line 12 is connected to a bottom of the inner bath 7. The plating solution that has flowed into the overflow bath 8 is returned to the inner bath 7 through the plating-solution circulation line 12.

The plating apparatus further includes an anode holder 3 for holding an anode 2 made of metal (e.g., copper) and for immersing the anode 2 in the plating solution in the inner bath 7, and a substrate holder 6 for removably holding a substrate W, such as a wafer, and for immersing the substrate W in the plating solution retained in the inner bath 7. The anode 2 and the substrate W are disposed so as to face each other in the plating solution. The anode 2 is coupled to a positive electrode of a power source 10 via the anode holder 3, and a conductive layer, such as a seed layer formed on the surface of the substrate W, is coupled to a negative electrode of the power source 10 via the substrate holder 6.

The plating apparatus further includes an agitating paddle 14 for agitating the plating solution in proximity to the surface of the substrate W held by the substrate holder 6 in the inner bath 7, and a regulation plate 15 for regulating an electric potential distribution on the substrate W. The regulation plate 15 has an opening 15a for regulating an electric field in the plating solution. The agitating paddle 14 is disposed near the surface of the substrate W held by the substrate holder 6. In other words, the agitating paddle 14 is located between the substrate holder 6 and the anode holder 3. The agitating paddle 14 is disposed vertically and reciprocates parallel to the substrate W to thereby agitate the plating solution, so that sufficient metal ions can be uniformly supplied to the surface of the substrate W during plating of the substrate W. The regulation plate 15 is disposed between the agitating paddle 14 and the anode holder 3.

The substrate holder 6 for holding the substrate W will be described. As shown in FIGS. 2 through 5, the substrate holder 6 includes a first holding member 40 having a rectangular plate shape and a second holding member 44 rotatably coupled to the first holding member 40 through a hinge 42. Although in this embodiment the second holding member 44 is configured to be openable and closable through the hinge 42, it is also possible to dispose the second holding member 44 opposite to the first holding member 40 and to move the second holding member 44 away from and toward the first holding member 40 to thereby open and close the second holding member 44.

The first holding member 40 may be made of vinyl chloride. The second holding member 44 includes a base portion 46 and a ring-shaped seal holder 48. The seal holder 48 may be made of vinyl chloride so as to enable a retaining ring 50, which will be described later, to slide well. An annular substrate-side sealing member 52 (see FIG. 4 and FIG. 5), which projects inwardly, is attached to an upper portion of the seal holder 48. This substrate-side sealing member 52 is placed in pressure contact with a periphery of the surface of the substrate W to seal a gap between the second holding member 44 and the substrate W when the substrate W is held by the substrate holder 6. An annular holder-side sealing member 58 (see FIG. 4 and FIG. 5) is attached to a surface, facing the first holding member 40, of the seal holder 48. This holder-side sealing member 58 is placed in pressure contact with the first holding member 40 to seal a gap between the first holding member 40 and the second holding member 44 when the substrate W is held by the substrate holder 6. The holder-side sealing member 58 is located at the outer side of the substrate-side sealing member 52.

Figure 5:
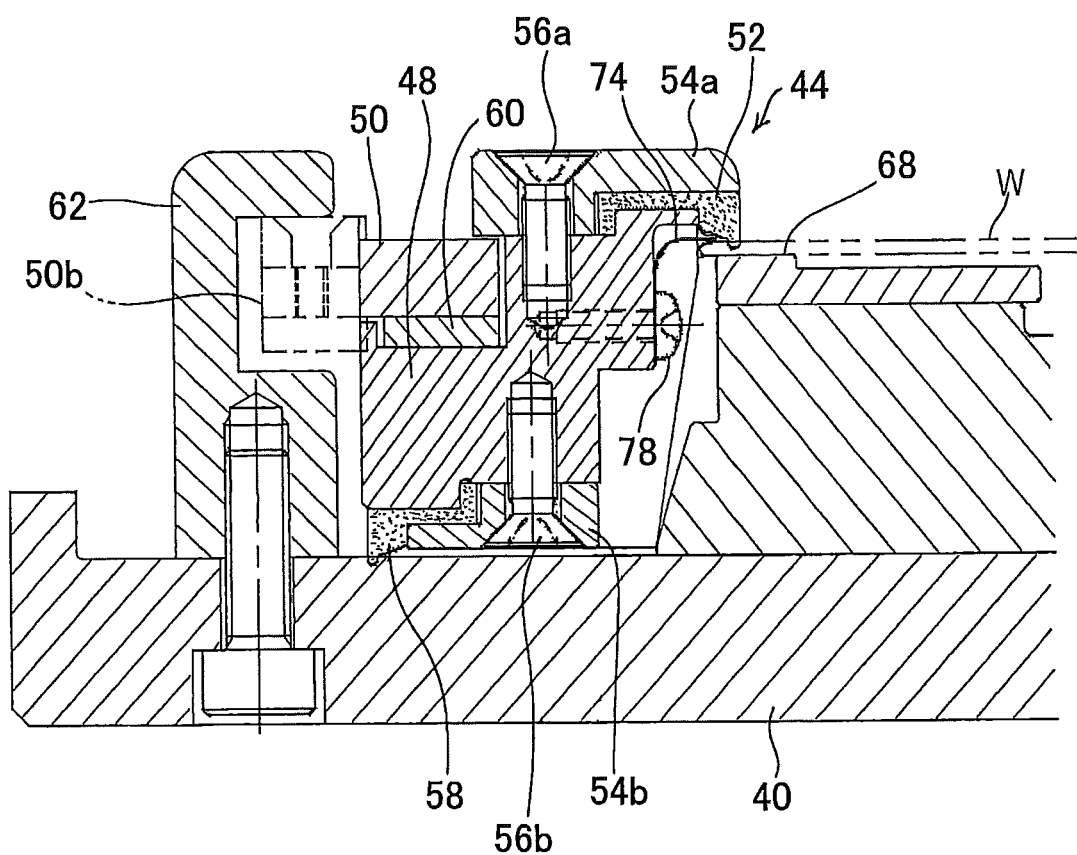
FIG. 5 is an enlarged view showing an encircled area indicated by symbol A shown in FIG. 4.

As shown in FIG. 5, the substrate-side sealing member 52 is sandwiched between the seal holder 48 and a first mounting ring 54a, which is secured to the seal holder 48 by fastening tools 56a, such as screws. The holder-side sealing member 58 is sandwiched between the seal holder 48 and a second mounting ring 54b, which is secured to the seal holder 48 by fastening tools 56b, such as screws.

The seal holder 48 has a stepped portion at a periphery thereof, and the retaining ring 50 is rotatably mounted to the stepped portion through a spacer 60. The retaining ring 50 is inescapably held by an outer peripheral portion of the first mounting ring 54a. This retaining ring 50 is made of a material (e.g., titanium) having high rigidity and excellent acid and alkali corrosion resistance and the spacer 60 is made of a material having a low friction coefficient, for example PTFE, so that the retaining ring 50 can rotate smoothly.

Inverted L-shaped clampers 62, each having an inwardly projecting portion and located at the outer side of the retaining ring 50, are secured to the first holding member 40 at equal intervals along a circumferential direction of the retaining ring 50. The retaining ring 50 has, on its outer circumferential surface, outwardly projecting portions 50b arranged at positions corresponding to positions of the clampers 62. A lower surface of the inwardly projecting portion of each clamper 62 and an upper surface of each projecting portion 50b of the retaining ring 50 are inclined in opposite directions along the rotational direction of the retaining ring 50 to form inclined surfaces. A plurality (e.g., three) of upwardly projecting protrusions 50a are provided on the retaining ring 50 at predetermined locations along the circumferential direction of the retaining ring 50. The retaining ring 50 can be rotated by pushing and moving each protrusion 50a in a lateral direction by means of a rotating pin (not shown).

With the second holding member 44 open, the substrate W is inserted into the central portion of the first holding member 40, and the second holding member 44 is then closed through the hinge 42. Subsequently the retaining ring 50 is rotated clockwise so that each projecting portion 50b of the retaining ring 50 slides into the inwardly projecting portion of each clamper 62. As a result, the first holding member 40 and the second holding member 44 are fastened to each other and locked by engagement between the inclined surfaces of the retaining ring 50 and the inclined surfaces of the clampers 62. The second holding member 44 can be unlocked by rotating the retaining ring 50 counterclockwise to disengage the projecting portions 50b of the retaining ring 50 from the inverted L-shaped clampers 62.

When the second holding member 44 is fastened to the first holding member 40, a downwardly-protruding portion of the substrate-side sealing member 52 is placed in pressure contact with the periphery of the surface of the substrate W. The substrate-side sealing member 52 is pressed uniformly against the substrate W to thereby seal the gap between the periphery of the surface of the substrate W and the second holding member 44. Similarly, when the second holding member 44 is fastened to the first holding member 40, a downwardly-protruding portion of the holder-side sealing member 58 is placed in pressure contact with the surface of the first holding member 40. The sealing holder-side sealing member 58 is uniformly pressed against the first holding member 40 to thereby seal the gap between the first holding member 40 and the second holding member 44.

Figure 3:
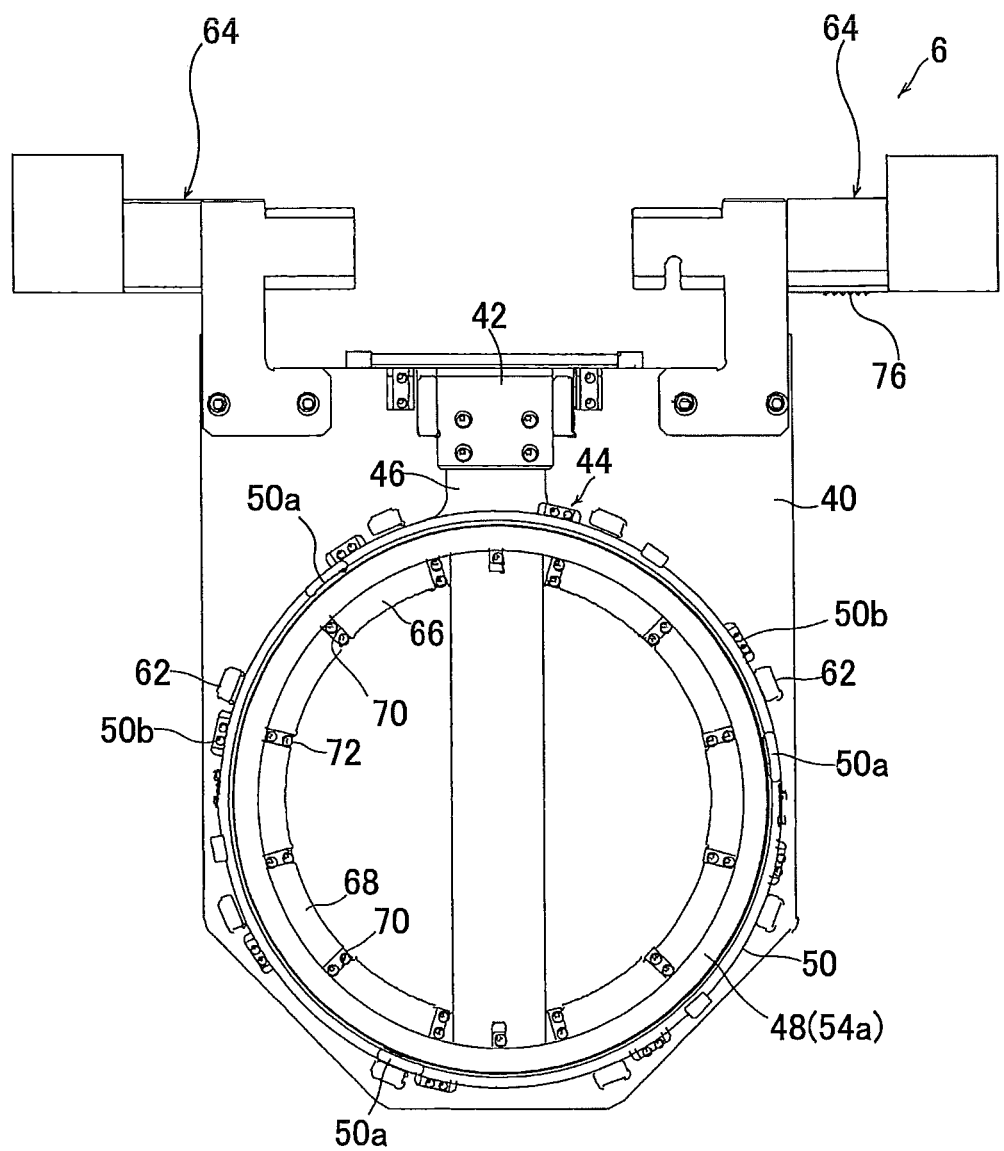
FIG. 3 is a plan view of the substrate holder shown in FIG. 2.
Figure 4:
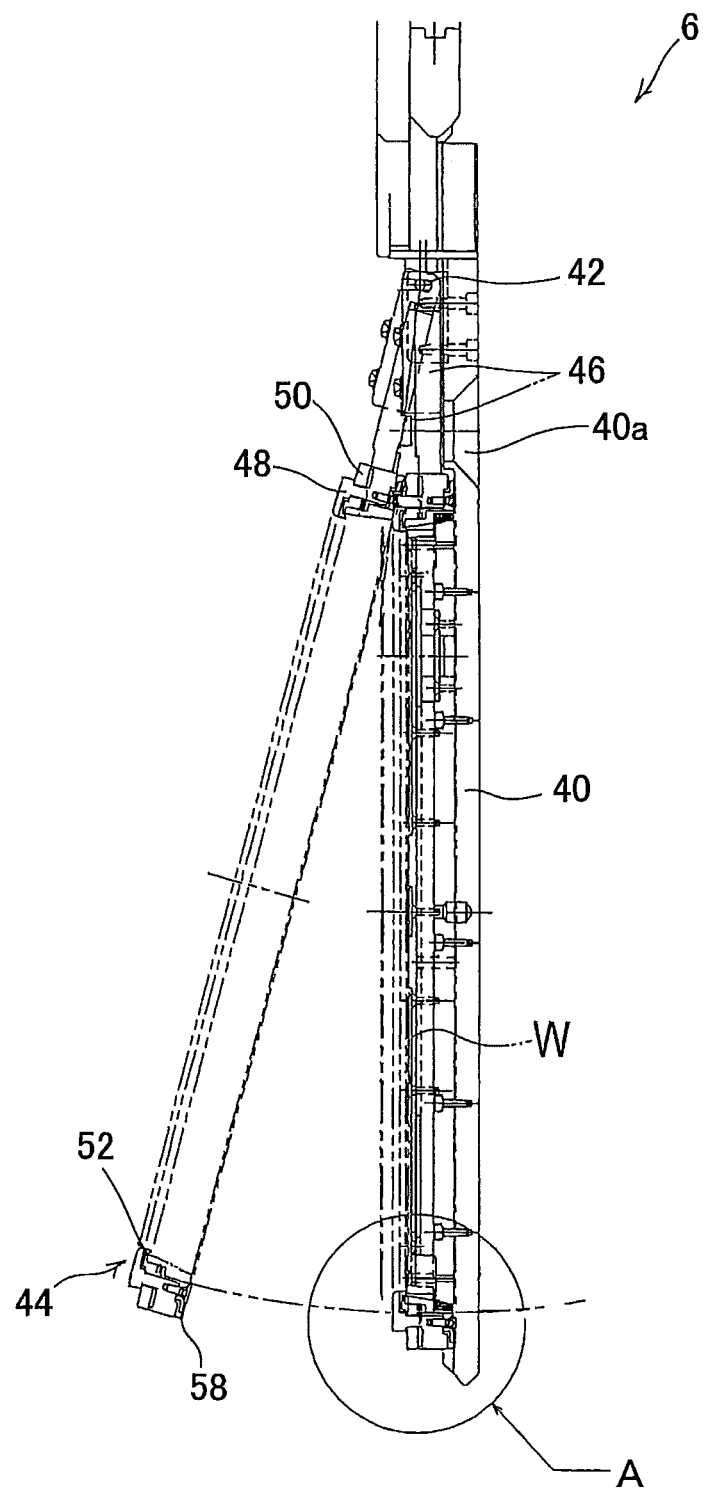
FIG. 4 is a right side view of the substrate holder shown in FIG. 2.

As shown in FIG. 3, a pair of T-shaped holder hangers 64 is provided on end portions of the first holding member 40. A ring-shaped protruding portion 66, which is in a ring shape corresponding to a size of the substrate W, is formed on an upper surface of the first holding member 40. This protruding portion 66 has an annular support surface 68 which comes in contact with the periphery of the substrate W to support the substrate W. The protruding portion 66 has arrangement portions 70 located at predetermined positions along a circumferential direction of the protruding portion 66.

A plurality of (e.g., 12 as illustrated) electrical conductors (electrical contacts) 72 are disposed in the arrangement portions 70, respectively. These electrical conductors 72 are coupled respectively to wires extending from connection terminals 76 provided on the holder hanger 64. When the substrate W is placed on the support surface 68 of the first holding member 40, end portions of the electrical conductors 72 come into elastic contact with lower portions of electrical contacts 74 shown in FIG. 5.

The electrical contacts 74, which are to be electrically connected to the electrical conductors 72, are secured to the seal holder 48 of the second holding member 44 by fastening tools 78, such as screws. Each of the electrical contacts 74 has a leaf spring-like contact portion located at the outer side of the substrate-side sealing member 52 and projecting inwardly. This spring-like contact portion is springy and bends easily. When the substrate W is held by the first holding member 40 and the second holding member 44, the contact portions of the electrical contacts 74 come into elastic contact with the peripheral surface of the substrate W supported on the support surface 68 of the first holding member 40.

The second holding member 44 is opened and closed by a not-shown pneumatic cylinder and by a weight of the second holding member 44 itself. More specifically, the first holding member 40 has a through-hole 40a, and the second holding member 44 is opened by extending a piston rod of the pneumatic cylinder through the through-hole 40a to push up the seal holder 48 of the second holding member 44. The second holding member 44 is closed by its own weight when the piston rod is retracted.

Figure 6A:
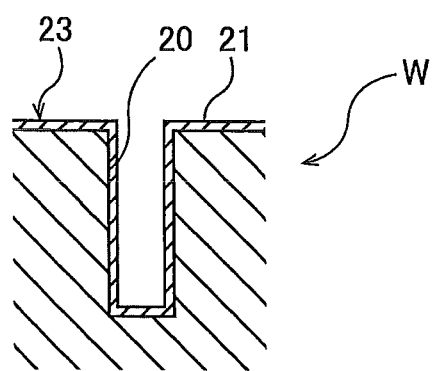
FIG. 6A, FIG. 6B, FIG. 6C, and FIG. 6D are views showing a process for filling a via-hole of the substrate with copper.

FIGS. 6A through 6D are views showing a process for filling a via-hole 20, formed in the substrate W, with copper 22. As shown in FIG. 6A, the via-hole 20, having a diameter in a range of 1 µm to 20 µm and a depth in a range of 50 µm to 200 µm, is formed in the substrate W. The diameter and the depth of the via-hole 20 are not limited to the above specific dimensions. A conductive layer 21 as a feeding layer for electroplating is formed on the surface of the substrate W including an inner surface of the via-hole 20. The agitating paddle 14 reciprocates parallel to the surface of the substrate W to agitate the plating solution existing between the anode 2 and the substrate W. In this state, voltage is applied between the anode 2 and the conductive layer 21, so that plating of the substrate W is started. The copper 22 is an example, and other metal may be filled into the via-hole 20.

Additives contained in the plating solution exert an influence on deposition of the copper 22. The additives include an accelerator for accelerating the deposition of the copper 22 and a suppressive-component containing agent, such as a suppressor and a leveler (i.e., leveling agent) for suppressing the deposition of the copper 22. Examples of the accelerator include sulfuric compound, such as bis (3-sulfopropyl) disulfide (SPS), and mercapto propanesulfonic acid sodium salt (MPS). Examples of the suppressor include a high molecular surface active agent, such as polyethylene glycol. Examples of the leveler include a nitrogen compound, such as polyethyleneimine (PEI) or janus green B (JGB). The plating solution is produced by adding the additives to a base solution, such as a copper sulfate solution.

Figure 6B:
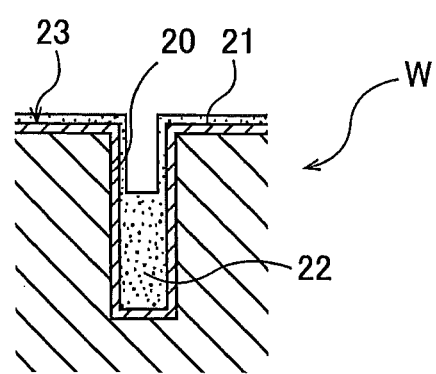
Figure 6C:
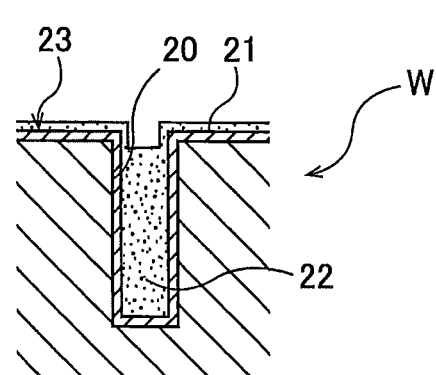

When plating of the substrate W is performed while agitating the plating solution, the deposition of the copper 22 is suppressed at a field portion 23 of the substrate W and at an entrance of the via-hole 20 where the plating solution flows at high speed, because of an effect of the suppressive-component containing agent. In contrast, the plating solution flows at low speed on a bottom of the via-hole 20. As a result, a small amount of suppressive-component containing agent is supplied to the bottom of the via-hole 20, while the accelerator acts effectively. In this manner, the deposition of the copper 22 is suppressed in an area where the plating solution flows fast, while the deposition of the copper 22 is accelerated in an area where the plating solution flows slowly. This is because the suppressive-component containing agent, which has a larger molecular weight than that of the accelerator, is not likely to reach the bottom of the via-hole 20 by diffusion. Therefore, as shown in FIG. 6B, the copper 22 is preferentially deposited upwardly from the bottom of the via-hole 20. As a result, as shown in FIG. 6C, the via-hole 20 can be filled with the copper 22 while preventing the entrance of the via-hole 20 from being closed by the copper 22.

Figure 6D:
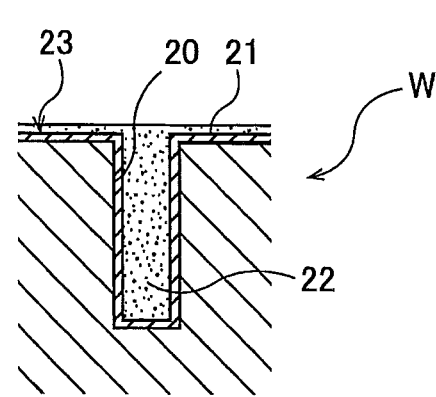

As shown in FIG. 6D, when the copper 22 having a predetermined film thickness is deposited on the conductive layer 21 in the field portion 23 after the via-hole 20 is completely filled with the copper 22, the voltage application between the anode 2 and the substrate W is stopped. Further, the reciprocation of the agitating paddle 14 is stopped, so that the plating of the substrate W is terminated.

When the plating solution containing the additive is used, a concentration of the additive changes mainly with an amount of plating processes (i.e., the number of plated substrates). As shown in FIG. 1, the plating apparatus includes a voltage measuring device 24 for measuring the voltage applied between the substrate W and the anode 2, a plating controller 25 for controlling the concentration of the additive in the plating solution based on a measured value of the voltage, and a concentration adjuster 28 for adjusting the concentration of the additive in the plating solution according to a command from the plating controller 25. The voltage measuring device 24 is coupled to the power source 10 and the plating controller 25, and is configured to send the measured value of the voltage applied to the substrate W, i.e., the measured value of the voltage applied between the substrate W and the anode 2, to the plating controller 25. The voltage measuring device 24 has a fine resolution on the order of not more than "mV", and is configured to be able to detect a very small change in the voltage during plating of one substrate.

Figure 7:
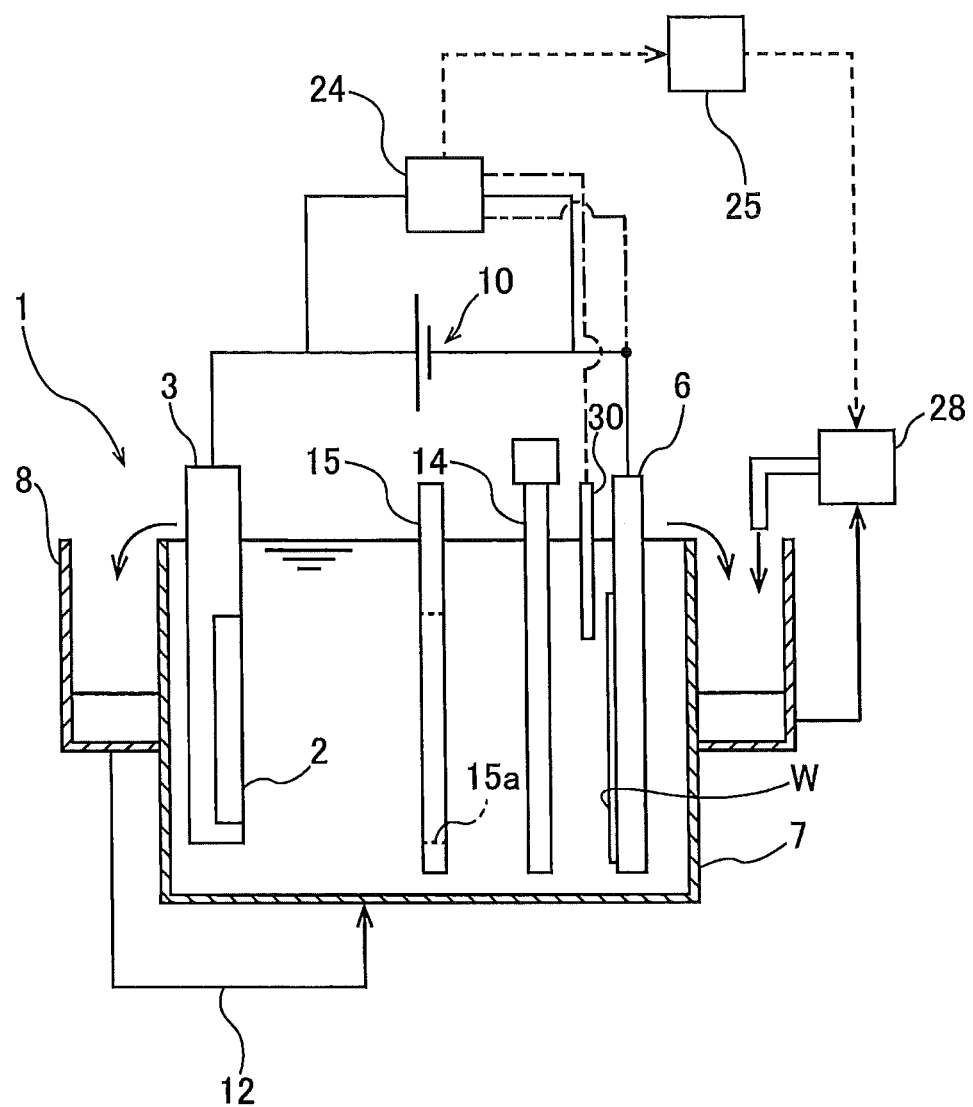
FIG. 7 is a view showing a modified example of the plating apparatus shown in FIG. 1.

FIG. 7 is a view showing a modified example of the plating apparatus shown in FIG. 1. As shown in FIG. 7, a reference electrode (or a standard electrode) 30, which provides a standard of an electric potential when the voltage is measured, may be immersed in the plating solution in the inner bath 7, and then a voltage between the reference electrode 30 and the substrate W may be measured, instead the voltage between the substrate W and the anode 2 is measured. The reference electrode 30 is preferably disposed in proximity to the substrate W so as not to prevent the agitation of the plating solution and the regulation of the electric field in the plating solution. As indicated by dot-and-dash lines in FIG. 7, the reference electrode 30 and the substrate W are electrically connected to the voltage measuring device 24. With this configuration, the voltage between the reference electrode 30 and the substrate W can be measured by the voltage measuring device 24. The method of measuring the voltage is not limited to the method of measuring the voltage between the substrate W and the anode 2 or the method of measuring the voltage between the substrate W and the reference electrode 30, and other means may be used so long as a change in a surface electric potential of the substrate W can be detected.

Figure 8:
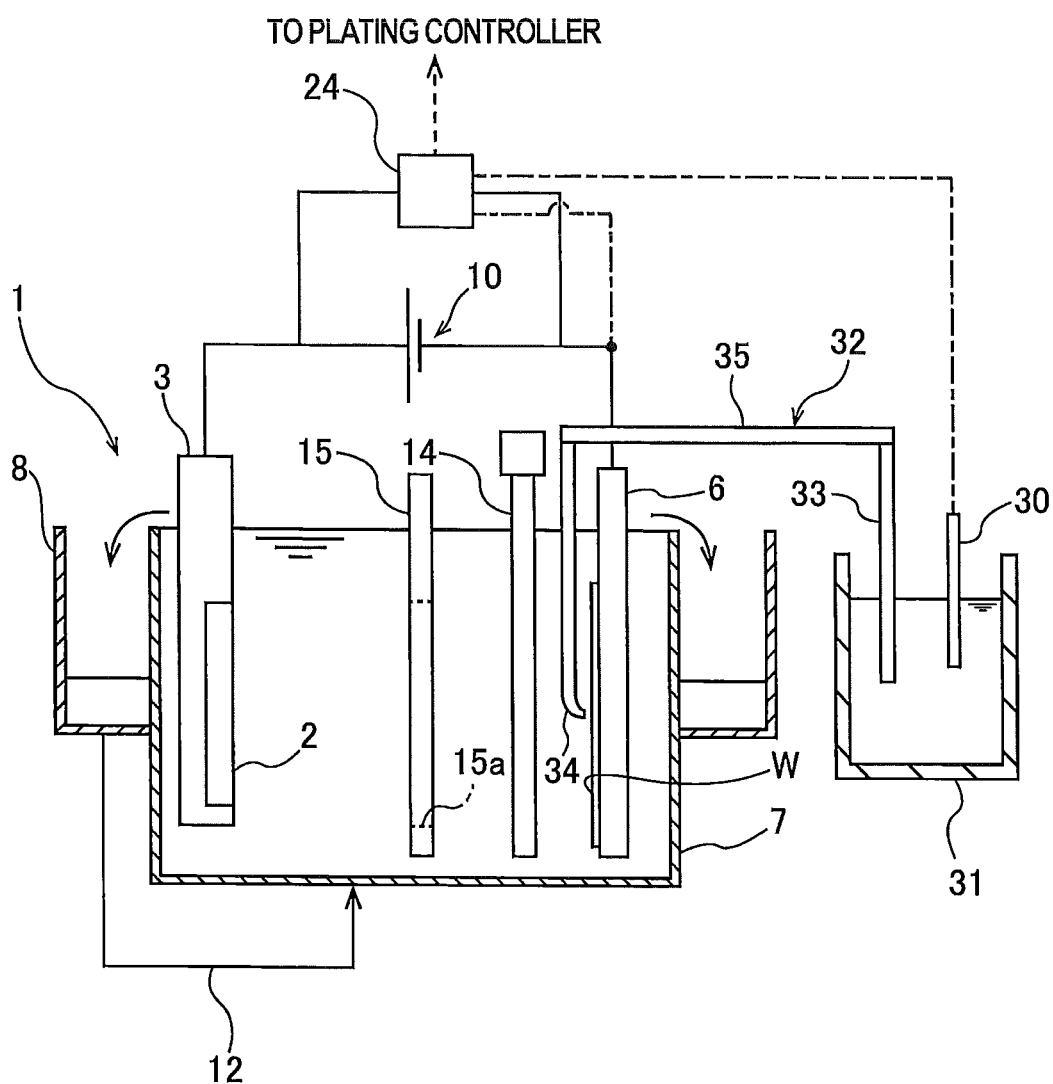
FIG. 8 is a view showing another modified example of the plating apparatus shown in FIG. 1.

FIG. 8 is a view showing another modified example of the plating apparatus shown in FIG. 1. In FIG. 8, the plating controller 25 and the concentration adjuster 28 are not shown for the purpose of making it easier to view the drawing. As shown in FIG. 8, the plating apparatus further includes a reference electrode bath 31 and a salt bridge 32 that is immersed in an electrolytic solution held in the reference electrode bath 31 and in the plating solution held in the inner bath 7. The electrolytic solution may be a potassium chloride (KCl) solution or a potassium sulfate ($K_2SO_4$) solution, which is used as an internal solution of the reference electrode 30. The reference electrode 30 is immersed in the electrolytic solution in the reference electrode bath 31. As indicated by dot-and-dash lines in FIG. 8, the reference electrode 30 and the substrate W are electrically connected to the voltage measuring device 24.

The salt bridge 32 is a connection pipe that is configured to electrically connect the plating solution in the inner bath 7 with the electrolytic solution in the reference electrode bath 31 while preventing the electrolytic solution from being mixed into the plating solution. The salt bridge 32 has a vertical pipe 33 immersed in the electrolytic solution in the reference electrode bath 31, a Luggin capillary 34 immersed in the plating solution in the inner bath 7, and a coupling pipe 35 that couples the vertical pipe 33 to the Luggin capillary 34. The Luggin capillary 34 may preferably be disposed in proximity to the substrate W so as not to prevent the agitation of the plating solution and the regulation of the electric field in the plating solution. The Luggin capillary 34 has a thin distal end that is curved toward the substrate W, so that the electric potential near the substrate W can be measured.

The plating controller 25 is configured to calculate an amount of change in the voltage per predetermined time, based on the measured value of the voltage transmitted from the voltage measuring device 24. The concentration adjuster 28 is coupled to the plating controller 25, and is configured to adjust the concentration of the additive in the plating solution held in the plating bath 1 according to the command from the plating controller 25. More specifically, when the concentration of the additive is to be increased, the concentration adjuster 28 extracts or draws a part of the plating solution from the overflow bath 8, and adds the additive to the extracted plating solution or to a new plating solution containing no additive, and then returns the plating solution, to which the additive has been added, to the overflow bath 8. The additive may be added to the plating solution in the overflow bath 8 adjacent to the inner bath 7. When the concentration of the additive is to be decreased, the concentration adjuster 28 extracts or draws a part of the plating solution from the overflow bath 8, and supplies a new plating solution containing no additive into the overflow bath 8. Such a method of adjusting the concentration of the plating solution is well known as a bleed and feed method. In order to lower the concentration of the additive, a dummy electrolysis may be performed.

Figure 9:
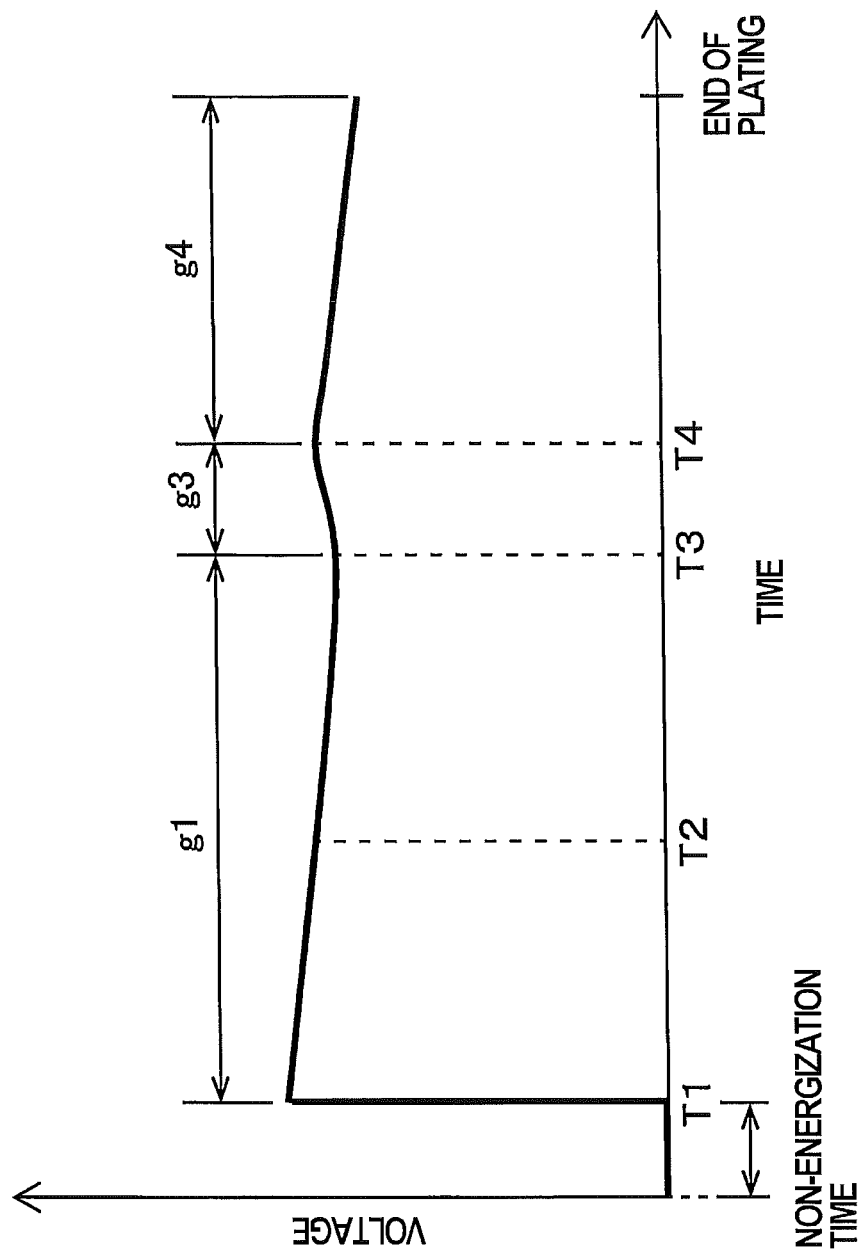
FIG. 9 is a graph schematically showing an example of a temporal change in voltage measured by a voltage measuring device.

FIG. 9 is a graph (voltage curve line) schematically showing an example of a temporal change in the voltage measured by the voltage measuring device 24. A horizontal axis represents time, and a vertical axis represents the voltage. The substrate W is pre-processed before being immersed in the plating solution (this process is referred to as a pre-wetting process), so that the via-hole 20 is filled with pure water. Thereafter, the substrate W is immersed in the plating solution. Before the voltage is applied between the anode 2 and the substrate W, the plating solution existing between the anode 2 and the substrate W is agitated by the agitating paddle 14. This agitating operation can replace the pure water in the via-hole 20 with the plating solution. A time during which the plating solution is agitated before the application of the voltage is referred to as a non-energization time. After a predetermined non-energization time has elapsed, the voltage is applied between the anode 2 and the substrate W, so that plating of the substrate W is started (a time T1 in FIG. 9). A state of the substrate W at the time T1 in FIG. 9 is shown in FIG. 6A.

In this embodiment, a current flowing through the substrate W is controlled to be constant from when the plating is started to when the plating is terminated. Immediately after the plating is started, the suppressive-component containing agent hardly exists on the bottom of the via-hole 20, while a large amount of accelerator exists. Therefore, the copper 22 is preferentially deposited upwardly from the bottom of the via-hole 20. In other words, the copper 22 is deposited upwardly from the bottom of the via-hole 20, while the copper 22 is hardly deposited around the entrance of the via-hole 20. Such a difference in a metal deposition rate can realize a so-called bottom-up growth.

In accordance with an increase in an amount of deposition of the copper 22, an electrical resistance between the substrate W and the anode 2 decreases with the plating time. Since the current passing through the substrate W is controlled to be constant by the power source 10, the voltage also decreases with time in accordance with the decrease in the electrical resistance (a time T2 in FIG. 9). A state of the substrate W at the time T2 in FIG. 9 is shown in FIG. 6B.

When the deposition of the copper 22 is further advanced until a filling percentage of the copper 22 in the via-hole 22 reaches 30% to 90%, the voltage turns from a downward trend to an upward trend in this embodiment (a time T3 in FIG. 9). This is because an amount of the suppressive-component containing agent supplied into the via-hole 20 increases according to the increase in the amount of the copper 22 deposited in the via-hole 20, thus increasing the electrical resistance in the via-hole 20. As the electrical resistance increases, the voltage also increases. A state of the substrate W at the time T3 is shown in FIG. 6C.

As indicated in a change in a voltage waveform at the time T3 in FIG. 9, when the amount of change in the voltage per predetermined time (hereinafter referred to as a voltage rate) turns from negative to positive, i.e., when the voltage turns from the downward trend to the upward trend, 30% to 90% of the via-hole 20 is filled with the copper 22 as shown in FIG. 6C. In other words, an aspect ratio of an unfilled part of the via-hole 20 becomes lower than an initial aspect ratio of the via-hole 20. Thus, in order to increase a filling rate of the copper 22, a current density on the substrate W may be increased by increasing the voltage at the time T3 at which the voltage rate increases. In an example, the current density is increased 1.5 to 5 times. By increasing the current density, the plating time can be effectively shortened, compared with a plating operation with a constant current density from when the plating is started to when the plating is terminated. Usually, it is necessary to determine a timing of increasing the current density in the plating process through many experiments. In this embodiment, the timing of increasing the current density can be determined by the voltage waveform reflecting an actual progress of plating. Therefore, it is possible to reduce a burden of determining plating conditions and eliminate the influence of various variation factors.

Further, when the voltage rate turns from negative to positive, an agitating intensity of the plating solution by the agitating paddle 14 is decreased to a degree lower than an agitating intensity of the plating solution when the voltage rate is negative, in order to lower the effect of the suppressive-component containing agent. As a result, a time required for plating the substrate W can be further shortened without forming void.

When the deposition of the copper 22 further progresses until the via-bole 20 is completely filled with the copper 22, the voltage turns from the upward trend to the downward trend again (a time T4 in FIG. 9). This is because the electrical resistance decreases according to an increase in thickness of the copper 22. A state of the substrate W at the time T4 in FIG. 9 is shown in FIG. 6D. Therefore, it is desirable to terminate the plating operation when the voltage turns from the upward trend to the downward trend (i.e., when the voltage rate turns from positive to negative). According to the embodiment, a plating end point can be accurately determined based on the change in the voltage. The plating may be terminated after a preset time has elapsed from a point of time when the voltage turns from the upward trend to the downward trend. When the plating of the substrate W is terminated, the application of the voltage is stopped and the reciprocation of the agitating paddle 14 is stopped. Monitoring of the voltage and determination of the plating end point based on the change in the voltage are performed by the plating controller 25.

Although the progress of plating and the change in the voltage waveform have been described with reference to FIG. 9, the voltage during plating may be varied depending on various conditions. Specifically, the electrical resistance decreases with the increase in the thickness of the copper 22 on the substrate of the substrate W. In addition, the electrical resistance increases until the via-hole 20 is completely filled with the copper 22 because the suppressive-component containing agent is easily diffused as the aspect ratio of the via-hole 20 is lowered as a result of the progress of the filling process of the via-hole 20 with the copper 22.

The change in the voltage during plating depends on which is dominant, the increase in the film thickness of the copper 22 or the increase in the amount of diffusion of the suppressive-component containing agent. More specifically, the voltage decreases when the decrease in the electrical resistance due to the increase in the film thickness of the copper 22 is dominant. On the other hand, the voltage increases when the increase in the electrical resistance due to the increase in the amount of the diffusion of the suppressive-component containing agent is dominant. Both the increase in the film thickness and the diffusion of the suppressive-component containing agent may be varied depending on various conditions. For example, the amount of diffusion of the suppressive-component containing agent may be varied depending on the type and the concentration of the suppressive-component containing agent. The type and the concentration of the suppressive-component containing agent are optimized based on a size and an aperture ratio of the via-hole 20. Further, the amount of diffusion of the suppressive-component containing agent can be varied depending on plating conditions, such as temperature, the agitating intensity, and the current density. Therefore, the voltage may increase or decrease depending on the plating conditions.

Further, after the time T4 at which the filling of the via-hole 20 with the copper 22 is completed, the electrical resistance increases as the accelerator remaining on an upper portion of the via-hole 20 is replaced with the suppressive-component containing agent. However, since the amount of diffusion of the suppressive-component containing agent may be varied depending on the plating conditions as described above, the voltage may increase or decrease.

In this situation, a time zone from the time T3 to the time T4 is a period of time immediately before the via-hole 20 is completely filled with the copper 22. During this time zone, the amount of diffusion of the suppressive-component containing agent into the via-hole 20 increases rapidly. Therefore, the voltage rate in this time zone from the time T3 to the time T4 is higher than the voltage rate in other time zone of the plating time. Specifically, where the voltage rate in a time zone from the time T1 to the time T3 is defined as g1, the voltage rate in a time zone from the time T3 to the time T4 is defined as g3, and the voltage rate in a time zone from the time T4 to the plating end point is defined as g4, the change in the voltage rate can be described as g1<g3 and g3>g4. Therefore, the voltage may change as shown in FIG. 10 and FIG. 11 which will be described below, and the voltage rate g3 may have a negative value while the voltage rate satisfies the relation of g1<g3.

Although the progress of plating and the change in the voltage waveform have been described with reference to FIG. 9, a manner of the change in the voltage during plating may be varied depending on various conditions, such as the type of additive, the size of the via-hole, and the aperture ratio of the via-hole. For example, as shown in FIG. 10, the voltage may increase from starting of the plating. In FIG. 10, the voltage increases during a period of time from a time T1' to a time T3'. When the plating progresses until the suppressive-component containing agent acts in the via-hole 20, the electrical resistance further increases. Therefore, the voltage further increases after the time T3'.

Figure 11:
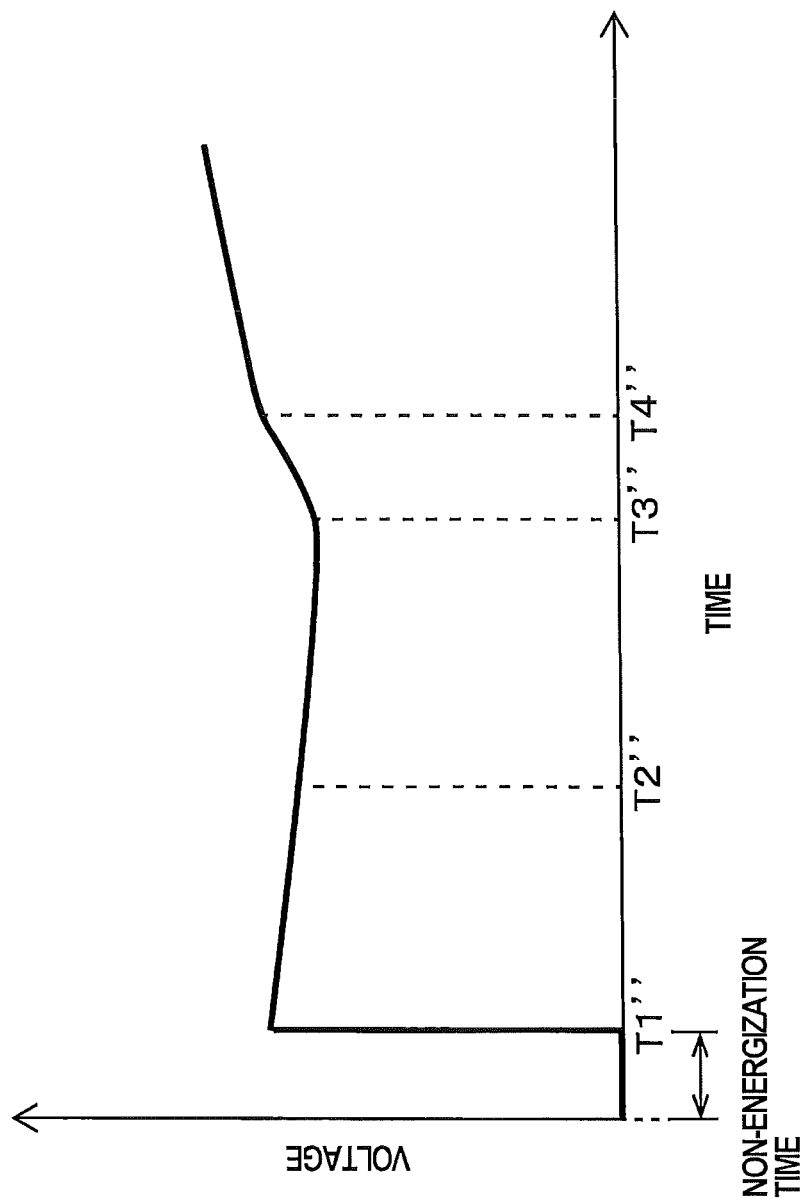
FIG. 11 is a graph schematically showing still another example of the temporal change in the voltage measured by the voltage measuring device.

While FIG. 9 shows the example in which the voltage turns to the downward trend after the via-hole 20 is completely filled with the copper 22, the voltage may continue to increase even after a time T4", as shown in FIG. 11, depending on the type of additive or a distribution state of the additive.

Figure 10:
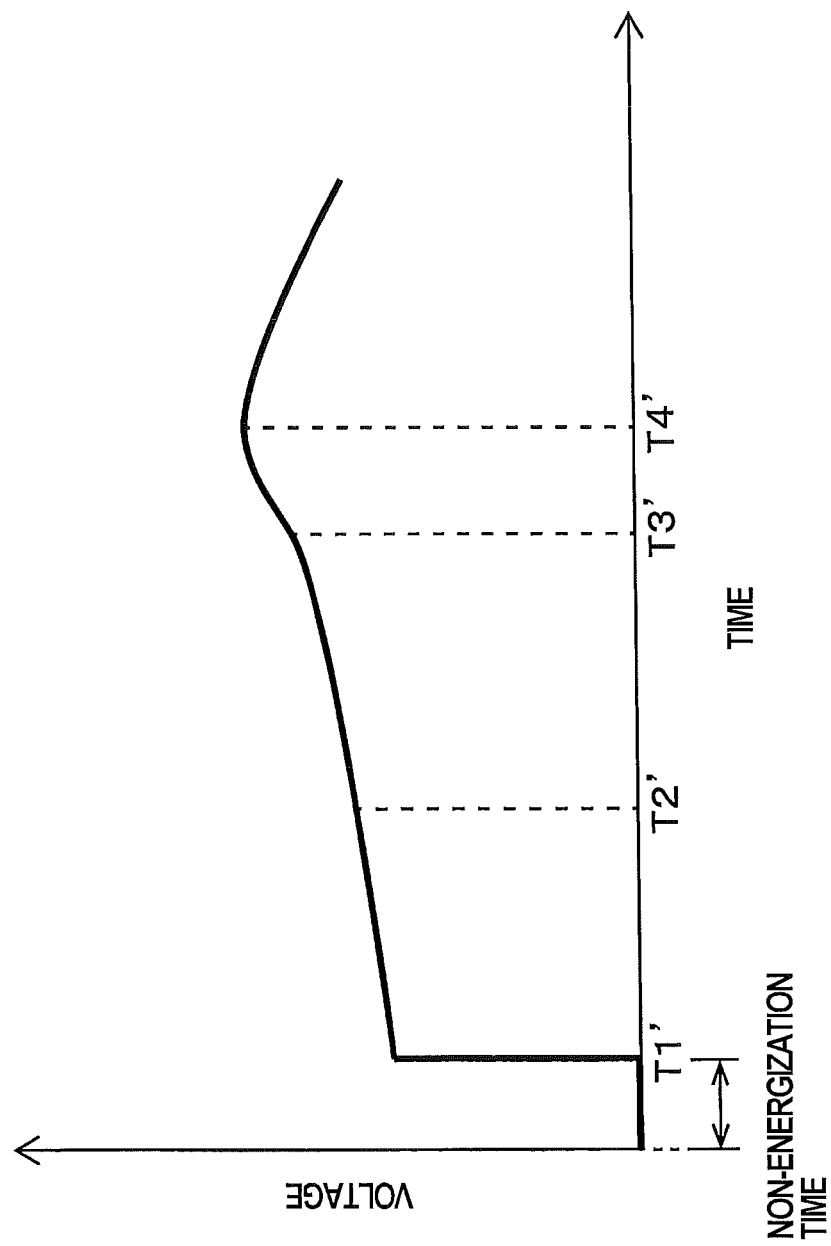
FIG. 10 is a graph schematically showing another example of the temporal change in the voltage measured by the voltage measuring device.

As seen from FIGS. 9 through 11, a point of time when the bottom-up growth becomes slow due to the effect of the suppressive-component containing agent in the via-hole 20 (i.e., the time T3 in FIG. 9, the time T3' in FIG. 10, and a time T3" in FIG. 11) can be described as a point of time at which voltage rate (i.e., a slope of the voltage curve) increases in excess of a predetermined variation range. A point of time when the via-hole 20 is completely filled with the copper 22 (i.e., the time T4 in FIG. 9, a time T4' in FIG. 10, the time T4" in FIG. 11) can be described as a point of time at which the voltage rate (i.e., the slope of the voltage curve) decreases in excess of (or out of) the predetermined variation range. The above-described variation range is a predetermined reference range indicating an extent of the change in the voltage rate for determining a point of change in the voltage rate. The point of time at which the voltage rate goes out of the variation range is determined to be the point of change in the voltage rate.

The plating controller 25 may compare the voltage rate with a predetermined threshold value, instead of determining whether or not the voltage rate goes out of the predetermined variation range. Specifically, a first threshold value for determining a point of time at which the bottom-up growth becomes slow (the time T3 in FIG. 9, the time T3' in FIG. 10, and the time T3" in FIG. 11) and a second threshold value for determining a point of time at which the via-hole 20 is completely filled with the copper 22 (the time T4 in FIG. 9, the time T4' in FIG. 10, and the time T4" in FIG. 11) may be provided in advance. The point of time when the bottom-up growth becomes slow (i.e., the time T3 in FIG. 9, the time T3' in FIG. 10, and the time T3" in FIG. 11) is a point of time at which the voltage rate exceeds the first threshold value. The point of time when the via-hole 20 is completely filled with the copper 22 (i.e., the time T4 in FIG. 9, the time T4' in FIG. 10, the time T4" in FIG. 11) is a point of time at which the voltage rate decreases below the second threshold value after the voltage rate has exceeded the first threshold value. In the case of the voltage waveform as shown in FIG. 9, the first threshold value and the second threshold value may be set to zero. The plating controller 25 emits the command to the power source 10 when the voltage rate increases beyond the first threshold value to permit the power source 10 to increase the current density. On the other hand, the plating controller 25 emits the command to the power source 10 when the voltage rate decreases below the second threshold value to permit the power source 10 to stop the application of the voltage, thereby terminating the plating.

In order to judge whether the filling of the via-hole 20 with the metal is properly being performed, a time (which may be a time range or a time zone) at which the voltage rate is supposed to reach the first threshold value may be predetermined. If the voltage rate has reached the first threshold value earlier than the predetermined time, or if the voltage rate does not reach the first threshold after the predetermined time has elapsed, it is presumed that a failure has occurred in the process of filling the via-hole 20 with the metal. In such a case, the plating controller 25 may command the power source 10 to stop the application of the voltage to thereby terminate the plating. Further, the plating controller 25 may emit an alarm. Further, a time (which may be a time range or a time zone) at which the voltage rate is supposed to reach the second threshold value may be predetermined. This predetermined time may be used as an index for detecting a failure that has occurred in the process of filling the via-hole 20 with the metal.

The inventors have confirmed through experiments that the change in the concentration of the additive in the plating solution can be judged based on the voltage rate (i.e., the amount of change in the voltage per predetermined time) during plating. More directly, in order to realize a desirable process of filling the via-hole with the metal, the inventers have confirmed through experiments that the voltage rate can be used to judge whether the additive effectively functions.

A predetermined control range of the voltage rate is stored in the plating controller 25. If the voltage rate, calculated by the plating controller 25, falls outside the control range, the plating controller 25 emits a command to the concentration adjuster 28 so that the voltage rate falls within the control range. Upon receiving this command, the concentration adjuster 28 adjusts the concentration of the additive in the plating solution in the plating bath 1, as described above.

Figure 12:
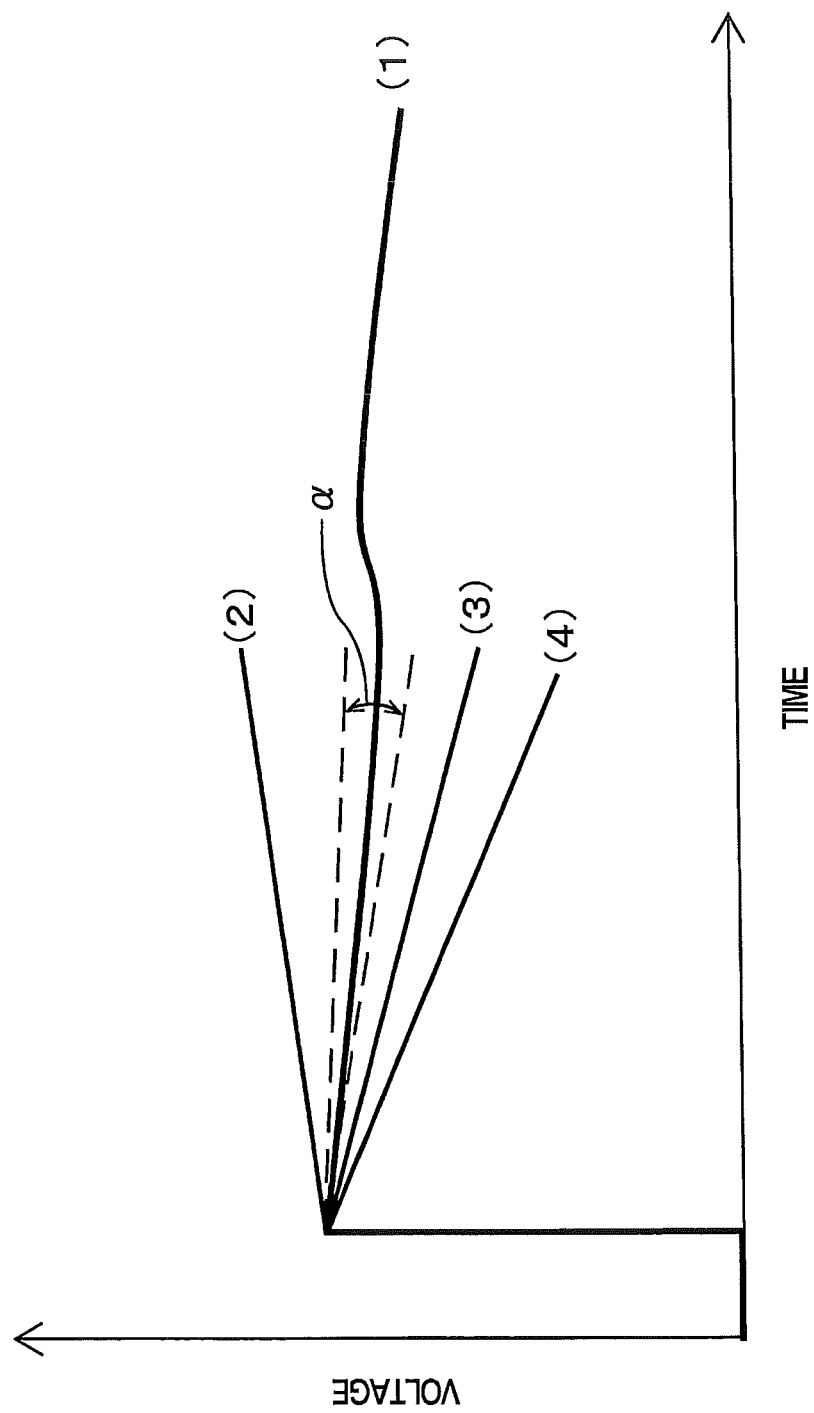
FIG. 12 is a graph showing the temporal change in the voltage that varies depending on a concentration of a suppressive-component containing agent.

The voltage rate can be varied depending on the concentration of the additive in the plating solution. An example of this will be described below with reference to FIG. 12 and FIGS. 13A through 13D. FIG. 12 is a graph showing a temporal change in the voltage varying depending on the concentration of the suppressive-component containing agent which is one of the additives. FIGS. 13A through 13D are views showing deposition states of the copper 22 that vary depending on the concentration of the suppressive-component containing agent.

Figure 13A:
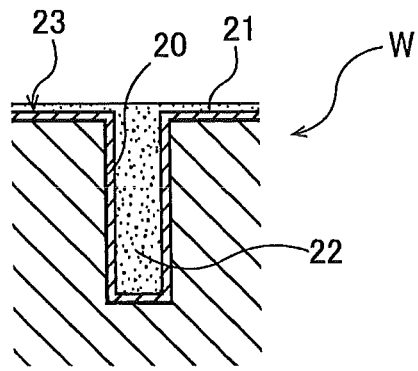
FIG. 13A, FIG. 13B, FIG. 13C, and FIG. 13D are views showing deposition states of copper that vary depending on the concentration of the suppressive-component containing agent.
Figure 13B:
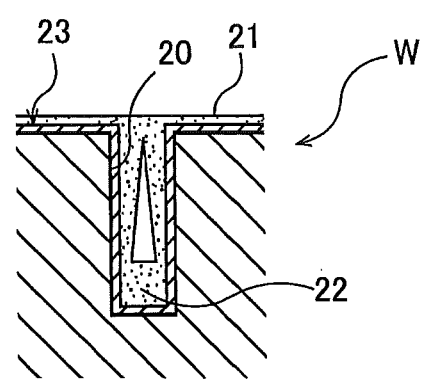

As indicated by a graph (1) in FIG. 12, when the voltage rate (i.e., the slope of the voltage curve) falls within the predetermined control range (which is represented by "a" in FIG. 12), the entirety of the via-hole 20 is filled with the copper 22 with no void, as shown in FIG. 13A. A graph (2) in FIG. 12 represents the voltage rate falling outside the control range. This graph (2) indicates a case where the voltage rate increases due to an increase, for some reason, in the concentration of the suppressive-component containing agent in excess of a desired concentration range. In such a case, as shown in FIG. 13B, a void is formed in the via-hole 20. This is because the suppressive-component containing agent having a high concentration is delivered to the bottom of the via-hole 20 to suppress the upward deposition of the copper 22 in the via-hole 20 and, as a result, the entrance of the via-hole 20 is closed with the copper 22.

Figure 13C:
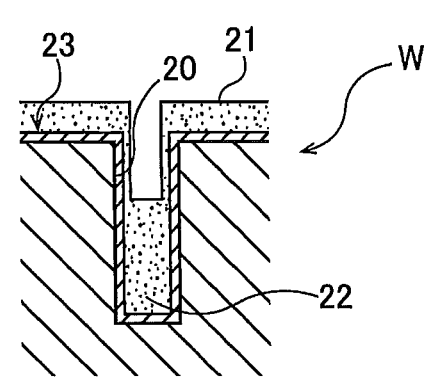

A graph (3) in FIG. 12 represents the voltage rate when it is lower than the predetermined control range a. This graph (3) indicates a case where the voltage decreases significantly with time due to a decrease, for some reason, in the concentration of the suppressive-component containing agent below the desired concentration range. In such a case, as shown in FIG. 13C, the copper 22 is excessively deposited on the field portion 23 of the substrate W, while the via-hole 20 is not filled with the copper 22 within a predetermined time.

Figure 13D:
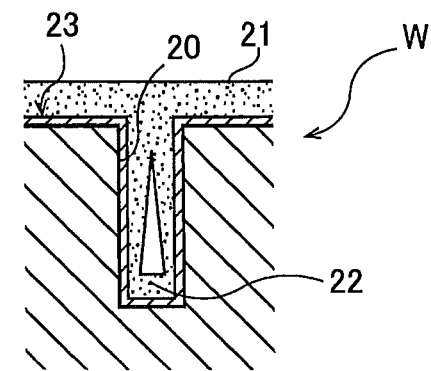

If the concentration of the suppressive-component containing agent in the plating solution further decreases, the voltage rate further decreases as indicated by a graph (4) in FIG. 12. In this case, as shown in FIG. 13D, the copper 22 is excessively deposited on the field portion 23 of the substrate W, thus forming a void in the via-hole 20. This is because the suppressive effect on the deposition of the copper 22 is lowered on a side wall in the via-hole 20, and the entrance of the via-hole 20 is closed with the copper 22 before the via-hole 20 is filled with the copper 22.

As can be seen from the graph (2), the graph (3), and the graph (4) shown in FIG. 12, the voltage rate varies depending on the change in the concentration of the suppressive-component containing agent. One of the reasons for the change in the voltage rate is as follows. As described above, the voltage rate depends on two factors: the decrease in the electrical resistance due to the increase in the film thickness of the copper 22 on the surface of the substrate W; and the increase in the electrical resistance due to the increase in the amount of diffusion of the suppressive-component containing agent. When the concentration of the suppressive-component containing agent increases, the copper 22 is not likely to be deposited on the surface of the substrate W, and the increase in the film thickness of the copper 22 is suppressed. Therefore, the voltage rate increases when the concentration of the suppressive-component containing agent is high.

In the case where the concentration of the suppressive-component containing agent is high, the voltage rate tends to further increase in a latter stage of plating than in an initial stage of plating. The reason for this is as follows. In the initial stage of plating, since the aspect ratio of the via-hole 20 is high, the suppressive-component containing agent having a large molecular weight is less likely to reach the bottom of the via-hole 20 by diffusion. Even if the concentration of the suppressive-component containing agent in the plating solution in its entirety is high, the amount of the suppressive-component containing agent diffused into the via-hole 20 does not greatly change. Therefore, the voltage increases only due to the increase in the suppressive effect on the plating reaction in the field portion 23. Therefore, a slight change in the concentration of the suppressive-component containing agent hardly affects the change in the voltage rate.

In contrast, in the latter stage of plating, the suppressive-component containing agent can easily reach the bottom of the via-hole 20 by diffusion, because the aspect ratio of the via-hole 20 is lowered. Therefore, the higher the concentration of the suppressive-component containing agent in the plating solution is, the larger the amount of the diffusion of the suppressive-component containing agent. Therefore, the electrical resistance increases greatly, compared with the case where the concentration of the suppressive-component containing agent is appropriate. As a result, the voltage rate increases greatly.

In the case where the concentration of the suppressive-component containing agent is low, the film thickness of the copper 22 on the field portion 23 is likely to increase, because of an insufficient ability to suppress the plating reaction on the field portion 23 of the substrate W. Further, the amount of the suppressive-component containing agent diffused into the via-hole 20 is small. Therefore, the voltage rate decreases.

The graph (1) in FIG. 12 indicates the example in which the voltage decreases with time, while the voltage may increase with time depending on conditions, such as the type of additive and the size of the via-hole, as described above.

The plating controller 25 is configured to calculate the voltage rate from the measured value of the voltage sent from the voltage measuring device 24 during plating of the substrate W, and emit the command to the concentration adjuster 28 when the voltage rate falls outside the predetermined control range. The concentration adjuster 28 adjusts the concentration of the suppressive-component containing agent in the plating solution retained in the plating bath 1 according to the command from the plating controller 25. More specifically, when the voltage rate is lower than the predetermined control range (i.e., the voltage rate is smaller than a lower limit of the control range), the plating controller 25 emits the command for increasing the concentration of the suppressive-component containing agent in the plating solution. Upon receiving this command, the concentration adjuster 28 adds the suppressive-component containing agent to the plating solution in the plating bath 1 (e.g., to the plating solution in the overflow bath 8 adjacent to the inner bath 7) to thereby increase the concentration of the suppressive-component containing agent in the plating solution. Alternatively, the concentration adjuster 28 may extract a part of the plating solution from the plating bath 1 (e.g., from the overflow bath 8), add the additive to the extracted plating solution or to a new plating solution containing no additive, and return the plating solution, to which the additive has been added, to the plating bath 1 (e.g., to the overflow bath 8) to thereby increase the concentration of the suppressive-component containing agent in the plating solution.

Another method of adding the additive to the plating solution may include the steps of predetermining a relationship between a deviation of the voltage rate from the control range and an amount of the additive to be added, determining an amount of the additive to be added based on the relationship, and adding the determined amount of the additive to the plating solution in the plating bath 1 (e.g., in the overflow bath 8).

When the voltage rate is higher than the predetermined control range (i.e., the voltage rate is larger than an upper limit of the control range), the plating controller 25 emits the command for decreasing the concentration of the suppressive-component containing agent in the plating solution. Upon receiving this command, the concentration adjuster 28 extracts a part of the plating solution from the overflow bath 8, and adds a new plating solution, containing no suppressive-component containing agent, to the plating solution in the overflow bath 8 to decrease the concentration of the suppressive-component containing agent in the plating solution. In this manner, the concentration of the additive can be adjusted based on the voltage rate obtained during plating of the substrate W. As a result, the via-hole can be filled with the metal with no void.

In a concentration control method for the additive with use of a CVS technique, it is difficult to control the concentration of the suppressive-component containing agent, because by-products of the suppressive-component containing agent exert an influence on measurement results. In contrast, according to the present embodiment, it is possible to monitor the progress of the process of filling the via-hole 20 with metal during plating and to monitor whether the concentration of the additive is high or low in real time. The concentration of the additive can thus be adjusted based on the result of the monitoring.

Figure 14:
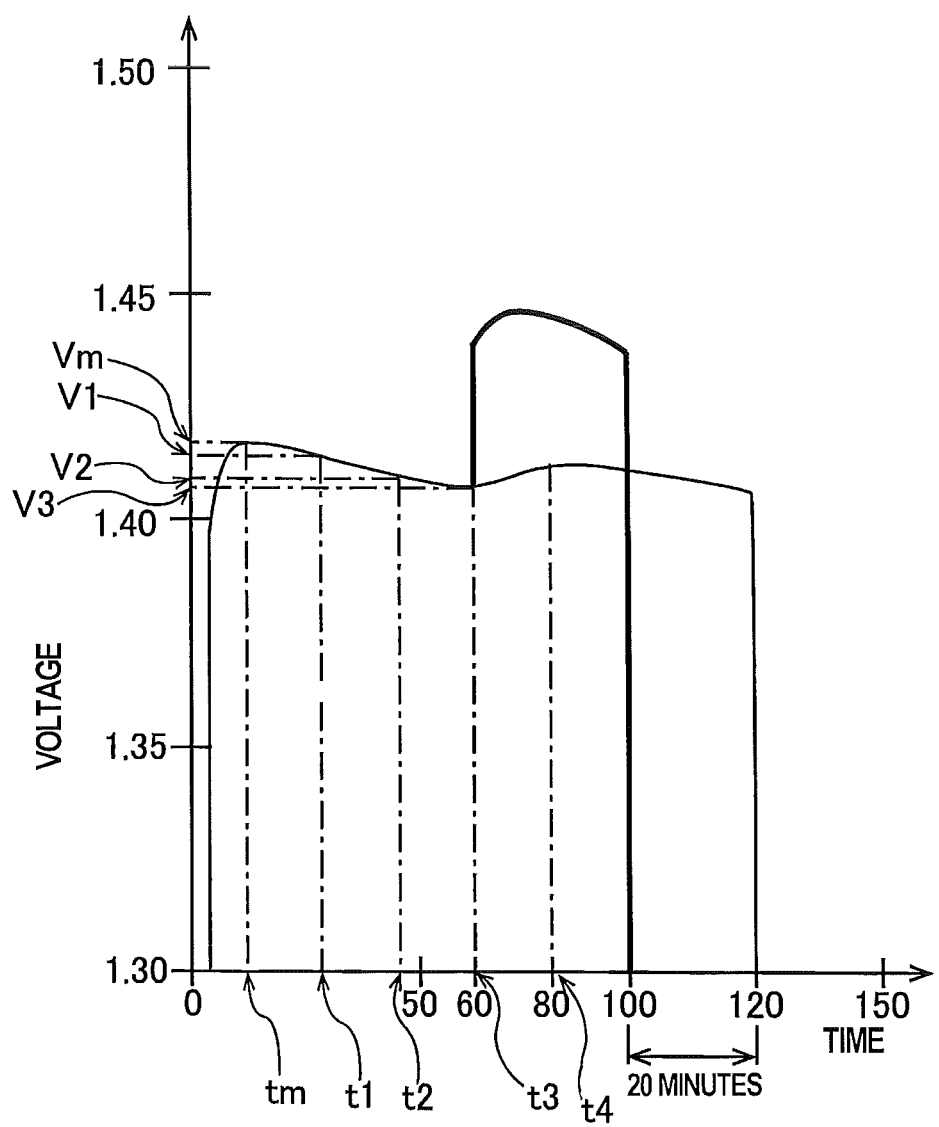
FIG. 14 is a graph showing an example of the temporal change in the voltage when the substrate is plated.

FIG. 14 is a graph showing an example of the temporal change in the voltage when the substrate W is plated. A horizontal axis represents time, and a vertical axis represents the voltage. In FIG. 14, the voltage decreases with time, and turns to the upward trend at around 60 minutes. This initial plating process is a first plating process of depositing metal upwardly from the bottom of the via-hole 20. In this first plating process, a filling percentage of the copper 22 in the via-hole 20 reaches 80% to 90%. In this example, when the voltage turns from the downward trend to the upward trend (i.e., when the voltage rate increases in excess of the predetermined variation range), it is preferable to increase the voltage applied between the substrate W and the anode 2 to thereby increase the current density on the substrate W. There are two reasons for this. The first reason is that, after the voltage turns to the upward trend, the suppressive-component containing agent is diffused onto the bottom of the via-hole 20 to adhere to the bottom and thus the bottom-up effect is lowered, and as a result, it takes a long time to fill an unfilled part of the via-hole 20 with the copper 22. The second reason is that, since the filling percentage of the copper 22 in the via-hole 20 increases, so-called pinch-off is less likely to occur even if the current density is increased. As a result, as indicated by a thick line in FIG. 14, a plating time of the substrate W can be shortened. In this example, a time required for the plating is shortened by about 20 minutes.

A plating process performed with the increased voltage as described above is a second plating process of filling the via-hole 20 with the metal. In this second plating process, as described above, the plating is performed with a current density (which is a second current density) higher than a current density (which is a first current density) in the first plating process. According to the present embodiment, the progress of plating can be accurately monitored based on the change in the voltage and the plating time can be shortened by increasing the current density at a proper timing. Such voltage control is performed by the plating controller 25. Specifically, when the voltage rate increases in excess of the predetermined variation range, the plating controller 25 emits the command to the power source 10 to permit the power source 10 to increase the voltage applied between the substrate W and the anode 2.

When the deposition of the copper 22 is further advanced and the via-hole 20 is completely filled with the copper 22, the voltage turns from the upward trend to the downward trend again. In FIG. 14, the voltage turns to the downward trend at around the time t4. At this stage, the plating is mostly completed. Therefore, in this example, the plating may be stopped when the voltage turns from the upward trend to the downward trend (i.e., when the voltage rate decreases in excess of the predetermined variation range after the voltage rate has increased in excess of the variation range). Specifically, when the voltage rate decreases in excess of the predetermined variation range after the voltage rate has increased in excess of the variation range, the plating controller 25 emits the command to the power source 10 to permit the power source 10 to stop the voltage applied between the substrate W and the anode 2. In this manner, according to the present embodiment, the plating controller 25 can accurately determine a plating end point based on the change in the voltage. The plating may be terminated after a preset time has elapsed from the point of time when the voltage rate decreases in excess of the variation range.

Processing of voltage signal (voltage value), transmitted from the voltage measuring device 24, performed by the plating controller 25 will be described below with reference to FIG. 14. After the plating is started, the plating controller 25 calculates the voltage rate $(=(V2-V1)/(t2-t1))$ from a voltage value V1 at a predetermined time t1 and a voltage value V2 at a predetermined time t2. After an initial make-up of the plating bath, the suppressive-component containing agent is consumed and changes its characteristics in accordance with the number of plated substrates. Therefore, the voltage rate is gradually lowered. When the voltage rate is lowered to be less than a predetermined set value, the plating controller 25 emits the command for increasing the concentration of the suppressive-component containing agent in the plating solution to the concentration adjuster 28. Upon receiving this command, the concentration adjuster 28 extracts a part of the plating solution from the overflow bath 8, adds the additive to the extracted plating solution or to a new plating solution containing no additive, and returns the plating solution, to which the additive has been added, to the overflow bath 8, thereby increasing the concentration of the suppressive-component containing agent in the plating solution.

The voltage rate is calculated based on the change in the voltage at the predetermined times t1, t2 in the above-described embodiment, while the present invention is not limited this embodiment. For example, the plating controller 25 may calculate an amount of change in the voltage per very short time, i.e., a first voltage rate that can vary from time to time, using the measured value of the voltage sent from the voltage measuring device 24, determine, from the first voltage rate, a time tm at which a voltage value has reached a maximum immediately after the plating is started, determine, from the first voltage rate, a time t3 at which the voltage turns from the downward trend to the upward trend, and calculate a second voltage rate ($=(V3-Vm)/(t3-tm)$) from a voltage value Vm at the time tm and a voltage value V3 at the time t3. The plating conditions may be set so as to increase the current density at the time t3.

After the time t3 is determined, the plating controller 25 may determine a time t4 at which the voltage turns from the upward trend to the downward trend based on the first voltage rate. The time t4 indicates that the copper 22 lying above the via-hole 20 is almost flush with the copper 22 lying on the field portion 23. Therefore, the plating may be terminated after a preset time has elapsed from the time t4. This preset time may be 0 (zero) seconds. In this case, the application of the voltage is stopped at the time t4 to terminate the plating.

Figure 15:
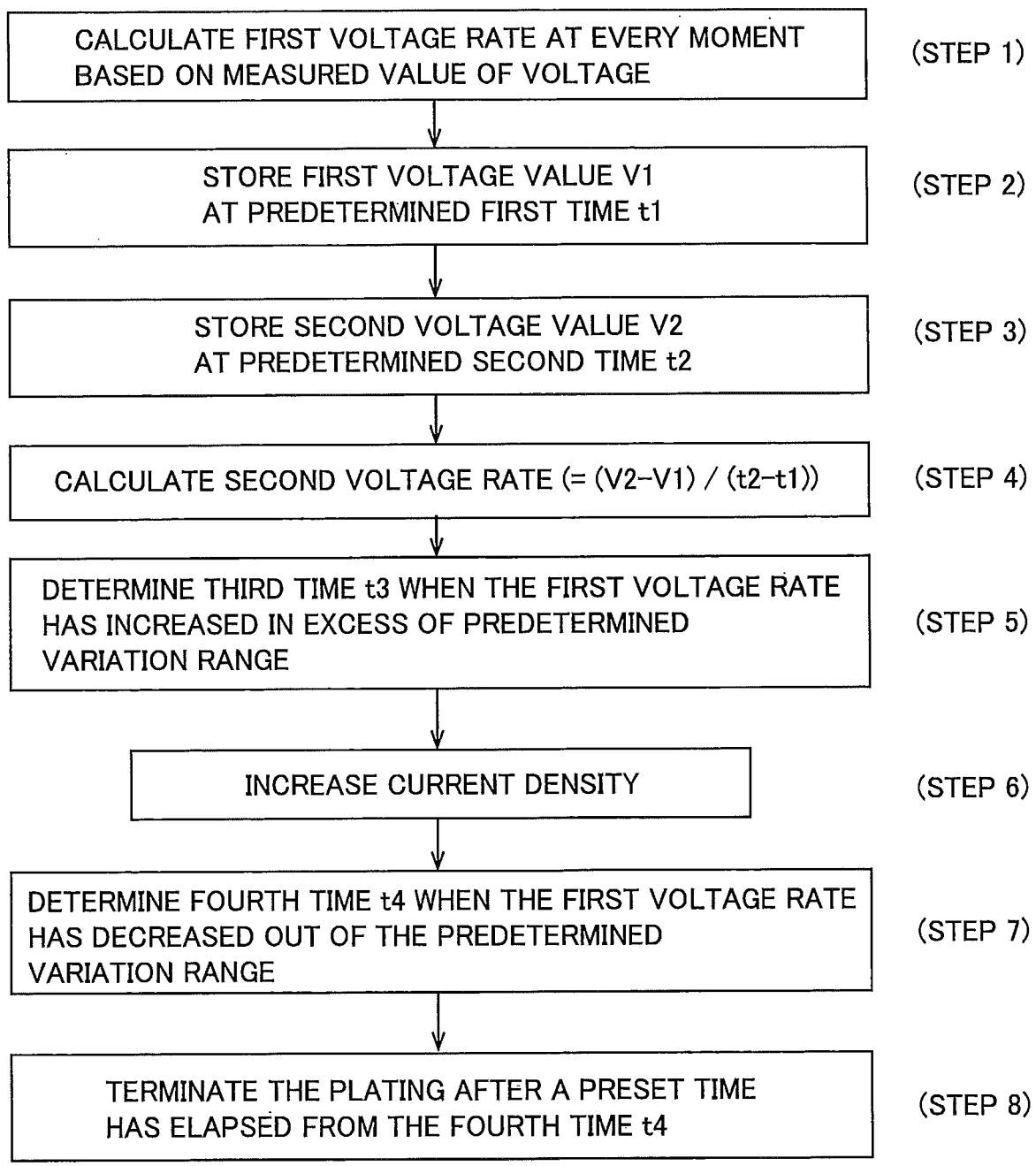
FIG. 15 is a view showing an example of control sequence of a plating controller.

FIG. 15 is a view showing an example of a process sequence of the plating controller 25. As shown in FIG. 15, after the plating is started, the plating controller 25 calculates the first voltage rate, which can vary from time to time, using the measured value of the voltage transmitted from the voltage measuring device 24 (step 1). The plating controller 25 stores a first voltage value V1 at a predetermined first time t1 (step 2), and then stores a second voltage value V2 at a predetermined second time t2 (step 3). The plating controller 25 then calculates the second voltage rate ($=(V2-V1)/(t2-t1)$) from these values (step 4).

If the second voltage rate is lower than the predetermined control range, the plating controller 25 emits a command for increasing the concentration of the suppressive-component containing agent in the plating solution. The concentration adjuster 28 receives this command and increases the concentration of the suppressive-component containing agent in the plating solution. If the second voltage rate is higher than the predetermined control range, the plating controller 25 emits a command for decreasing the concentration of the suppressive-component containing agent in the plating solution. The concentration adjuster 28 receives this command and decreases the concentration the suppressive-component containing agent in the plating solution.

The plating controller 25 determines a third time t3 at which the first voltage rate increases in excess of the predetermined variation range (step 5), and emits a command to the power source 10 to permit the power source 10 to increase the current density on the substrate W at the third time t3 (step 6). Further, the plating controller 25 determines a fourth time t4 at which the first voltage rate decreases in excess of the variation range after the first voltage rate has increased in excess of the variation range (step 7). The fourth time t4 is a point of time when the copper 22 lying over the via-hole 20 is approximately flush with the copper 22 on the field portion 23. The plating is terminated after a preset time has elapsed from the fourth time t4 (step 8). This preset time may include zero seconds. Therefore, the application of the voltage may be stopped at the fourth time t4 so that the plating is terminated.

While the embodiment has been discussed with reference to the voltage waveform shown in FIG. 14, it is also possible to use the voltage waveform as shown in FIG. 10 and FIG. 11 to control the concentration of the additive and determine a timing of increasing the plating current and a timing of terminating the plating. That is, it is possible to control the concentration of the additive by calculating the voltage rate based on the measured value of the voltage and by predetermining the appropriate control range.

Figure 16:
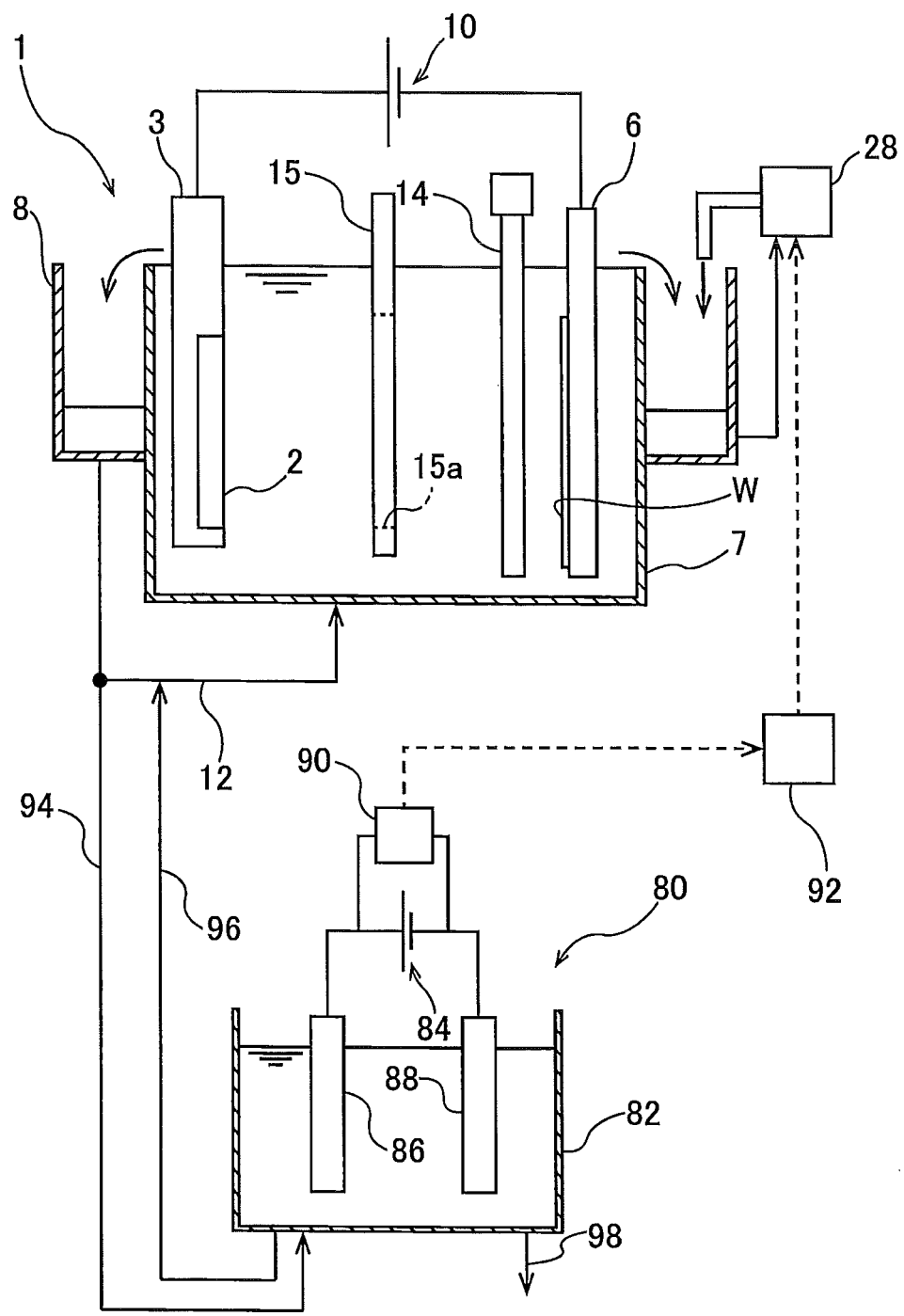
FIG. 16 is a schematic view showing another embodiment of the plating apparatus.

FIG. 16 is a schematic view showing another embodiment of the plating apparatus. The above-discussed embodiment is directed to the plating apparatus that measures the voltage applied between the anode 2 and the substrate W. In another embodiment, as shown in FIG. 16, the plating solution may be extracted from the plating bath 1, and the extracted plating solution may be delivered to a plating solution analyzer 80. A specific configuration of the plating apparatus will be described below with reference to FIG. 16.

As shown in FIG. 16, the plating apparatus includes the plating solution analyzer 80 for measuring the concentration of the additive in the plating solution. The plating solution analyzer 80 includes an analyzing bath 82 that stores therein the plating solution that has been extracted from the plating bath 1, a first electrode (an anode) 86 coupled to a positive electrode of a power source 84, and a second electrode (a cathode) 88 coupled to a negative electrode of the power source 84. The first electrode 86 and the second electrode 88 are immersed in the plating solution retained in the analyzing bath 82. The electrodes 86, 88 may be formed from Pt (platinum), Au (gold), Ag (silver), Pd (palladium), C (carbon), or SUS (stainless steel).

The plating solution analyzer 80 further includes a voltage measuring device 90 for measuring a voltage applied between the first electrode 86 and the second electrode 88, and a plating controller 92 for controlling the concentration of the additive contained in the plating solution in the plating bath 1 based on a measured value of the voltage obtained by the voltage measuring device 90. The voltage measuring device 90 is coupled to the plating controller 92, and is configured to send the measured value of the voltage applied between the first electrode 86 and the second electrode 88 to the plating controller 92.

One end of a plating-solution inflow line 94 is coupled to the plating-solution circulation line 12, and other end of the plating-solution inflow line 94 is coupled to a bottom of the analyzing bath 82. A part of the plating solution in the plating-solution circulation line 12 is delivered through the plating-solution inflow line 94 to the analyzing bath 82. When the delivery of the plating solution to the analyzing bath 82 is finished, the voltage is applied between the first electrode 86 and the second electrode 88.

When the voltage is applied between the first electrode 86 and the second electrode 88, metal (e.g., copper) is deposited on the second electrode 88. The voltage measuring device 90 is configured to measure the voltage applied to the second electrode 88. For example, the voltage measuring device 90 measures the voltage applied between the first electrode 86 and the second electrode 88. The plating controller 92 is configured to calculate an amount of change in the voltage per predetermined time, i.e., a voltage rate, based on the measured value of the voltage. The concentration adjuster 28 is coupled to the plating controller 92, and is configured to adjust the concentration of the additive in the plating solution held in the plating bath 1 according to a command from the plating controller 92.

One end of a plating-solution outflow line 96 for returning the plating solution to the inner bath 7 of the plating bath 1 is coupled to the bottom of the analyzing bath 82, and other end of the plating-solution outflow line 96 is coupled to the plating-solution circulation line 12. Further, a drain pipe 98 for draining the plating solution is coupled to the bottom of the analyzing bath 82. The plating solution in the analyzing bath 82 may be returned to the inner bath 7 through the plating-solution outflow line 96 and the plating-solution circulation line 12, or may be drained to an outside through the drain pipe 98.

Since no via-hole exists in the second electrode 88, the voltage rate is different from that in a case of plating a substrate having via-holes. However, the trend of the change in the voltage rate depending on the amount of the additive is the same. Therefore, once a control range of the appropriate voltage rate is predetermined, the concentration of the additive can be controlled, as with the above-described embodiment. A method of adding the additive to the plating solution may include the steps of predetermining a relationship between a deviation of the voltage rate from the control range and an amount of the additive to be added, determining an amount of the additive to be added based on the relationship, and adding the determined amount of the additive to the plating solution in the plating bath 1. Alternatively, another method of adding the additive to the plating solution may include the steps of extracting the plating solution from the plating bath 1, delivering the extracted plating solution to the analyzing bath 82, calculating the voltage rate after adding a predetermined amount of the additive to the plating solution in the analyzing bath 82, determining an appropriate amount of the additive, and then adding the determined amount of the additive to the plating solution in the plating bath 1. In this manner, since the concentration of the additive is determined using the plating solution analyzer 80, it is possible to determine whether the amount of the additive is large or small based on the change in the voltage rate even when a substrate W is not being plated.

Figure 17:
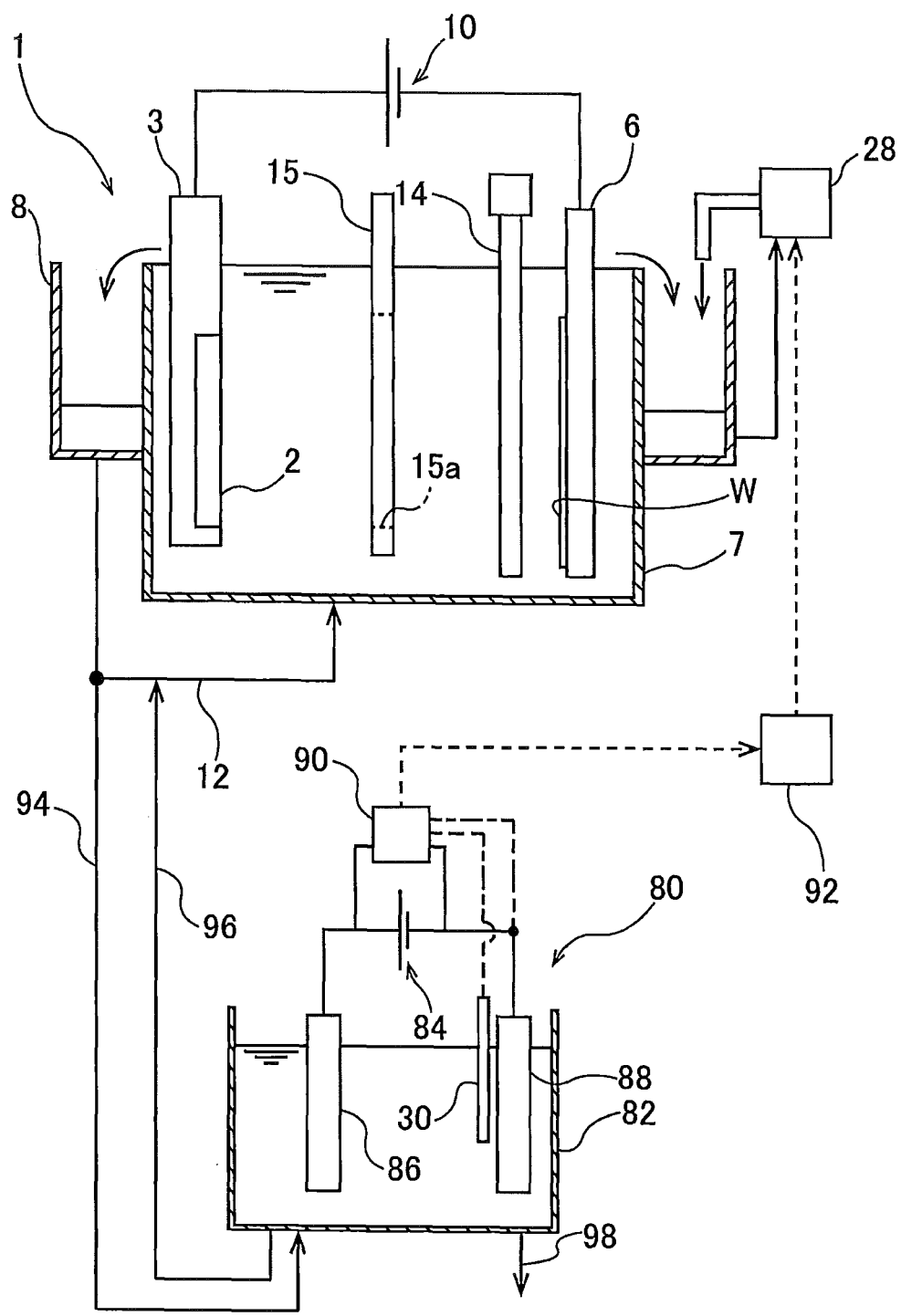
FIG. 17 is a view showing a modified example of the plating apparatus shown in FIG. 16.

FIG. 17 is a view showing a modified example of the plating apparatus shown in FIG. 16. As shown in FIG. 17, the plating solution analyzer 80 may measure a voltage between reference electrode 30 and the second electrode 88, instead of measuring the voltage between the first electrode 86 and the second electrode 88. The reference electrode 30 is immersed in the plating solution retained in the analyzing bath 82, and is disposed near the second electrode 88. As indicated by dot-and-dash lines in FIG. 17, the reference electrode 30 and the second electrode 88 are electrically connected to the voltage measuring device 90. Therefore, the voltage measuring device 90 can measure the voltage between the reference electrode 30 and the second electrode 88. The plating controller 92 calculates the voltage rate based on the measured value of the voltage.

Figure 18:
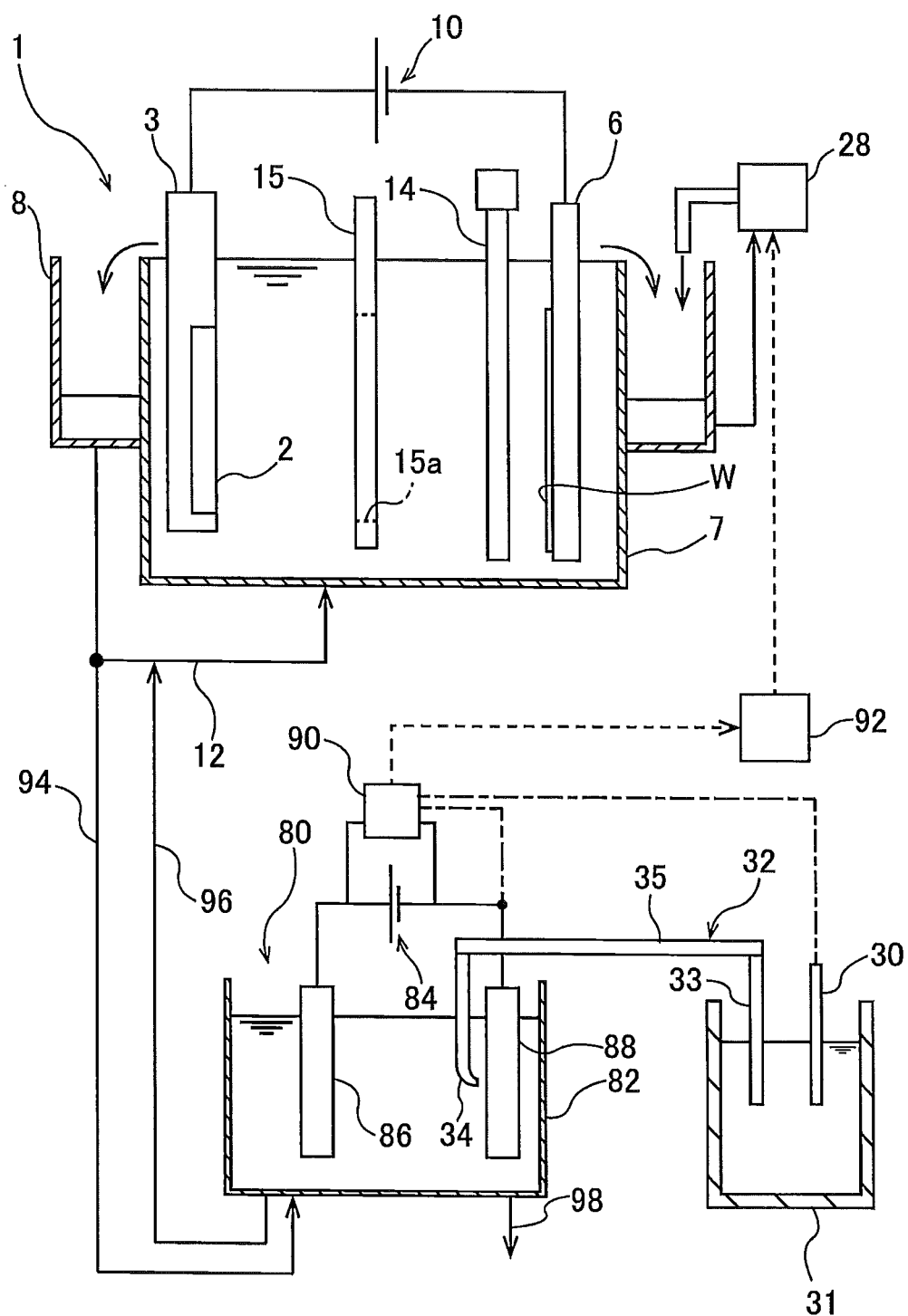
FIG. 18 is a view showing another modified example of the plating apparatus shown in FIG. 16.

FIG. 18 is a view showing another modified example of the plating apparatus shown in FIG. 16. As shown in FIG. 18, the plating solution analyzer 80 further includes reference electrode bath 31, reference electrode 30 immersed in electrolytic solution in the reference electrode bath 31, and salt bridge 32 immersed in the electrolytic solution in the reference electrode bath 31 and in the plating solution in the analyzing bath 82. The salt bridge 32 has the same construction as the salt bridge 32 described in FIG. 8, detailed explanations thereof are omitted. As indicated by dot-and-dash lines in FIG. 18, the reference electrode 30 and the second electrode 88 are electrically connected to the voltage measuring device 90. Therefore, the voltage measuring device 90 can measure a voltage between the reference electrode 30 and the second electrode 88. The plating controller 92 calculates the voltage rate based on the measured value of the voltage.

A concentration of an additive in the plating solution to be controlled other than the suppressive-component containing agent, i.e., a concentration of the accelerator, can be measured and controlled by the CVS technique. However, the present invention is not limited to the above-described embodiments that control the concentration of the suppressive-component containing agent based on the change in the voltage rate. The present invention can be applied to a technique for controlling a concentration of the accelerator based on a change in a voltage rate.

Although the embodiments of the present invention have been described above, it should be noted that the present invention is not limited to the above embodiments, and may be reduced to practice in various different embodiments within the scope of the technical concept of the invention.

What is claimed is:

1. A plating method comprising:
   disposing an anode and a substrate, having a via-hole formed in a surface thereof, so as to face each other in a plating solution containing an additive;
   applying a voltage between the anode and the substrate for filling the via-hole with metal;
   measuring the voltage applied to the substrate;
   calculating an amount of change in the voltage per predetermined time; and
   determining a first point of time at which the amount of change in the voltage per predetermined time exceeds a predetermined first threshold value;
   determining a second point of time at which the amount of change in the voltage per predetermined time decreases below a predetermined second threshold value;
   waiting a preset time after the second point of time; and then
   after waiting stopping application of the voltage.

2. The plating method according to claim 1, wherein the preset time includes zero seconds.

3. The plating method according to claim 1, further comprising:
   increasing a current density on the substrate when the amount of change in the voltage exceeds the predetermined first threshold value.

* * * * *